(12) United States Patent
Bowers et al.

(10) Patent No.: US 6,529,135 B1
(45) Date of Patent: Mar. 4, 2003

(54) INTEGRATED ELECTRIC MOTOR MONITOR

(75) Inventors: Stewart V. Bowers, Knoxville, TN (US); James R. Stevenson, Oak Ridge, TN (US); William E. Childress, Norris, TN (US)

(73) Assignee: CSI Technology, Inc., Wilmington, DE (US)

( * ) Notice: Subject to any disclaimer, the term of this patent is extended or adjusted under 35 U.S.C. 154(b) by 0 days.

(21) Appl. No.: 09/415,824

(22) Filed: Oct. 12, 1999

(51) Int. Cl.$^7$ .............................................. G08B 21/00
(52) U.S. Cl. ...................... 340/648; 340/679; 340/682; 340/683; 318/806
(58) Field of Search ................................. 340/648, 679, 340/635, 680, 682, 683; 318/806

(56) References Cited

U.S. PATENT DOCUMENTS

| | | | |
|---|---|---|---|
| 4,194,178 A | 3/1980 | Dumbeck | 340/870.17 |
| 4,470,092 A | 9/1984 | Lombardi | 361/23 |
| 4,495,448 A | 1/1985 | Dumbeck | 318/54 |
| 4,520,674 A | 6/1985 | Canada et al. | 73/660 |
| 4,525,763 A | 6/1985 | Hardy et al. | 361/24 |
| 4,659,976 A | 4/1987 | Johanson | 388/816 |
| 4,761,703 A | 8/1988 | Kliman et al. | 361/23 |
| 4,839,830 A | 6/1989 | Amey | 702/42 |
| 5,019,760 A | 5/1991 | Chu et al. | 318/490 |
| 5,189,350 A | 2/1993 | Mallett | 318/434 |
| 5,323,325 A | 6/1994 | Izumiya | 700/174 |
| 5,485,491 A | 1/1996 | Salnick | 376/245 |
| 5,530,343 A | 6/1996 | Bowers, III et al. | 324/173 |

(List continued on next page.)

FOREIGN PATENT DOCUMENTS

FR        2681942        9/1991

OTHER PUBLICATIONS

"Advanced Maintenance Technology", by B. R. Upadhyaya, et al., The University of Tennessee Nuclear Engineering Department, P/PM Technology, Apr. 1996, p. 36–41.

(List continued on next page.)

*Primary Examiner*—Daniel J. Wu
*Assistant Examiner*—Sihong Huang
(74) *Attorney, Agent, or Firm*—Luedeka, Neely & Graham, P.C.

(57) ABSTRACT

A method monitors an operational condition of an electric motor, and stores in a memory device general trend, prognostic, diagnostic, and hazardous event information indicative of the motor's operational condition. The method includes the steps of sensing characteristics indicative of the operational condition of the electric motor, such as vibration, temperature, magnetic flux, and the voltages applied to the motor's windings, and generating sensor signals related to the sensed characteristics. Upon the occurrence of a first circumstance, such when measurements of the motor's speed, winding temperature, and voltage, indicate that the motor is operating within its normal load profile, prognostic information is extracted from the sensor signals. The prognostic information provides a profile of the motor's operational condition over time without the influences of fluctuating loads, temperature, and voltage. Upon the occurrence of a second circumstance, such as when the motor's load factor is within a load factor range that is most common for the motor, diagnostic information is extracted from the sensor signals. The diagnostic information indicates the motor's operational condition when it is operating within its most common load zone. Upon occurrence of a third circumstance, such as an indication that the motor is operating abnormally, hazardous event information is extracted from the sensor signals and stored. The hazardous event information indicates the motor's condition at the time that a hazardous event, or fault, occurred. The general trend information is measured and stored at regular intervals to determine short- and long-term operational trends over time.

38 Claims, 11 Drawing Sheets

U.S. PATENT DOCUMENTS

| | | | | |
|---|---|---|---|---|
| 5,576,632 | A | 11/1996 | Petsche et al. | 324/772 |
| 5,629,870 | A | 5/1997 | Farag et al. | 700/286 |
| 5,631,839 | A | 5/1997 | Lemoine | 700/108 |
| 5,680,025 | A | 10/1997 | Bowers, III et al. | 318/806 |
| 5,710,723 | A | 1/1998 | Hoth et al. | 702/181 |
| 5,726,911 | A | 3/1998 | Canada et al. | 702/32 |
| 6,199,018 | B1 * | 3/2001 | Quist et al. | 318/806 |
| 6,297,742 | B1 * | 10/2001 | Canada et al. | 318/490 |

OTHER PUBLICATIONS

"Condition Assessment and Life Prediction of Rolling Element Bearings—Part 2", by Alexej Barkov, et al, Vibro Acoustical Systems and Technologies, Sound and Vibration/Sep. 1994, p. 27–31.

"Considerations of Coupling Selection, Installation and Alighnemtn: Effects on Motor Mechanical Performance", by Mark M. Hodowanec, IEEE 1996, p. 122–131.

IAS Motor Condition Monitoring Tutorial, Electrical Machines Committee IAS Annual Meeting, "Conventional Motor Protection Systems", by Jonathan D. Gardell, SanDiego, CA, Oct. 6, 1996.

"Instantaneous Power as a Medium for the Signature Analysis of Induction Motors", by Stanislaw F. Legowski, et al, IEEE Transactions on Industry Applications, vol. 32, No. 4, Jul./Aug. 1996, p. 904–909.

"Instantaneous Stator Power as a Medium for the Signature Analysis of Induction Motors", by Stanislaw F. Legowski, IEEE 1995, p. 619–624.

"Intelligent Microprocessor Based Devices Provide Advanced Motor Protection, Flexible Control, and Communication in Paper Mills", by S. F. Fang, et al., May 31, 1996.

IQ Pre–Alert Overview by Rockwell Automation Reliance Electric, Sep. 10, 1997.

IQ Intelligent Monitoring to Extend the Productive Life of 21st Century Motor–Dependent Processes by Rockwell Automation Reliance Electric.

"Intelligent Motor Technology" by Rockwell Automation Reliance Electric, May 8, 1997.

"Motor Condition Monitoring" Tutorial, Electrical Machines Committee, IAS Annual Meeting, Oct. 6, 1996.

"Motor Insulation Condition Assessment Using Expert Systems Software" by B. A. Lloyd, 1994 IEEE, p. 60–72.

"MotorStatus Integrated Condition Monitoring of AC Induction Motors", by Status Technologies.

"Motor Overload Protection Becomes 'Communications–Capable'" by Michael Babb, Control Engineering/Jun. 1996.

"MotorStatus 301", by Status Technologies.

"A New Approach to On–Line turn Fault Detection in AC Motors" by G. B. Kliman, et al., 1996 IEEE, p. 687–693.

"On–Line Mechanical Fault Detection in Induction Machines Using Stator Current Monitoring" by IAS '95 Tutorial, Oct. 8, 1995.

The Performance Analysis of Induction Motors with Artificial Neural Networks, 1995 IEEE, p. 1452–1455.

9th Power Plant Dynamics, Control & Testing Symposium Proceedings May 24–26, 1995, Department of Nuclear Engineering, The University of Tennessee, Knoxville, Tennessee.

"Reduce Motor Failure Management Program With Comprehensive" by High Hollowood, General Electric Co., PIMA/Nov. 1988.

"Sensors help you get maximum use from your motors" by Leslie Langnau, Product Focus: Controls & Sensors, Power Transmission Design, Sep. 1997.

"The Worlds' First Truly Intelligent Motor", IQ Intelligent AC Motors With PreAlert technology by Rockwell Automation Reliance Electric.

* cited by examiner

INTEGRATED ELECTRIC MOTOR MONITOR

TECHNICAL FIELD

The present invention is generally directed to a method and apparatus for monitoring the condition of electric motors. More particularly, it relates to a monitor system integrated into an electric motor to monitor and record various operating parameters during the life of the motor for the purpose of predicting failures and evaluating motor life.

BACKGROUND OF THE INVENTION

Electric motors, particularly alternating-current (AC) induction motors, are heavily employed in industrial and manufacturing facilities. AC induction motors are used to provide mechanical inputs for machinery in manufacturing facilities. Manufacturing downtime caused by a failure of an electric motor reduces productivity and profitability. Electric motors, therefore, are important elements of industrial facilities, and the health and condition of these motors must be closely monitored to anticipate and prevent motor failures that could result in costly unscheduled downtime.

Evaluating the extent of stator winding insulation degradation is a primary concern in determining the condition of an electric motor. As the motor ages, insulation breakdown occurs due to high motor temperature and other operating stresses. When insulation degradation reaches a critical point, the motor windings short together. Eventually, these faults short to ground, resulting in catastrophic motor failure.

Previous attempts have been made to provide electric motor monitoring systems capable of monitoring the condition of the motor. Many of these systems focus on measuring motor temperature, and estimating, based on the measured temperature, the degree of insulation degradation. Such systems use this estimation of insulation degradation as a way of predicting the remaining useful life of the motor.

While high motor temperature, and resultant insulation degradation can contribute to electric motor failures, it is not the only factor. There are many complex and interrelated operating characteristics of electric motors that affect the health and longevity of the motor. Factors such as loading, vibration, supply voltage quality, environmental conditions, and the number of motor starts/stops affect motor life. Thus, improved and more comprehensive motor monitors are needed.

SUMMARY OF THE INVENTION

The present invention addresses this and other needs by monitoring the operational condition of an electric motor, and storing in a memory device general trend, prognostic, diagnostic, and hazardous event information indicating the motor's operational condition. The invention records characteristics that indicate the operational condition of the motor, such as vibration, temperature, magnetic flux, and the voltages applied to the motor's windings.

Upon the occurrence of a first circumstance, such when measurements of the motor's speed, winding temperature, and voltage, indicate that the motor is operating within its normal load profile, prognostic information is extracted from the sensor signals. The prognostic information provides a profile of the motor's operational condition over time without the influences of fluctuating loads, temperature, and voltage.

Upon the occurrence of a second circumstance, such as when the motor's load factor is within a load factor range that is most common for the motor, diagnostic information is extracted from the sensor signals. The diagnostic information indicates the motor's operational condition when it is operating within its most common load zone.

Upon occurrence of a third circumstance, such as an indication that the motor is operating abnormally, hazardous event information is extracted from the sensor signals and stored. The hazardous event information indicates the motor's condition at the time that a hazardous event, or fault, occurred.

Preferred embodiments of the invention measure and store general trend information at regular intervals to determine short- and long-term operational trends over time. The general trend information provides additional information about the motor's condition when the motor is not operating within a normal range.

During a first time period, a preferred embodiment of the invention operates in a learning mode. At periodic intervals while in the learning mode, the invention determines values, such as voltage, temperature, and speed, from the sensor signals. The invention determines into which of several predetermined ranges each sensor value falls at each interval. At each periodic interval, a prognosis profile value is determined based on the sensor values. The invention determines a normal range for the prognosis profile value, which is the range within which the prognosis profile value most often falls during the first time period.

During a second time period that follows the first time period, the invention extracts prognostic information from the sensor signals, such as motor vibration, flux, and voltage spectra.

During the second time period, this prognostic information is stored in the memory device at periodic intervals only when the prognosis profile value falls within the normal range as determined in the learning mode.

Thus, by storing the vibration, flux, and voltage spectra only when the motor is operating within the typical range for these characteristics, the invention ensures that the vibration, flux, and voltage spectra that are stored in the memory are truly representative of the typical operational condition of the motor.

In another aspect, the invention provides an apparatus for monitoring operational characteristics of an electric induction motor over a period of time. The apparatus has sensors integrated into the motor for sensing characteristics that indicate the operational condition of the motor. These sensors generate sensor signals related to the sensed characteristics. Based on the sensor signals, a processor determines values, indicative of the motor's operational condition, at periodic measurement intervals during the period of time. The processor also determines into which of several predetermined value ranges that the values fall at each periodic measurement interval. Based on the number of times that the values fall into each of the predetermined load ranges during the period of time, the processor generates count values corresponding to the individual value ranges. A memory device stores the count values generated by the processor. Collectively, these count values form histograms that are stored in the memory device.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE PREFERRED EMBODIMENT

Figure 1:
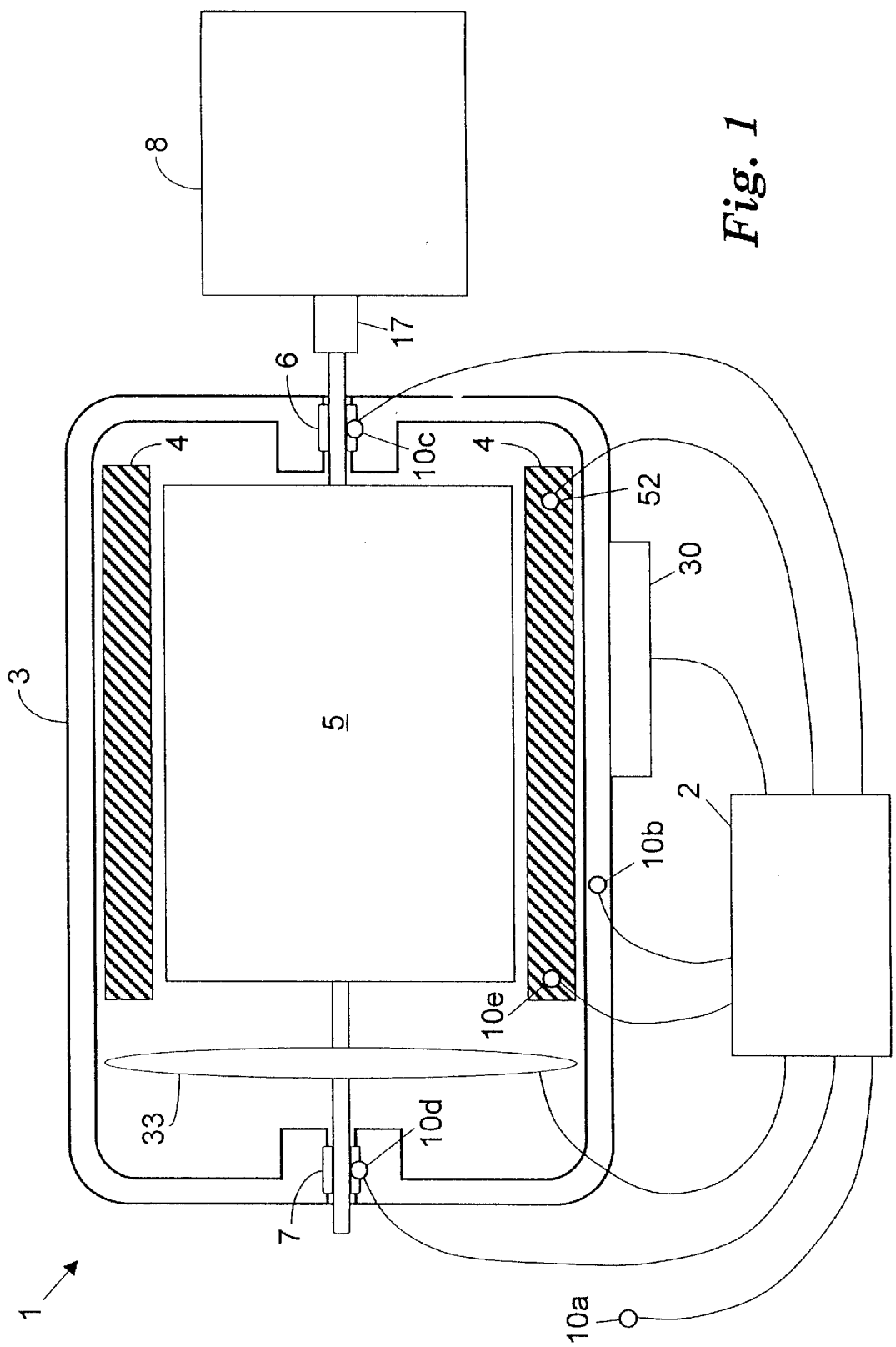
FIG. 1 is a sectional view of an electric motor and integrated monitoring system according to the invention.

Shown in FIG. 1 is an AC induction motor with an integrated condition monitoring system 1. The motor is comprised of a frame 3 that supports an inboard bearing 6 and an outboard bearing 7. The bearings 6 and 7 support a rotor 5, which is free to rotate on the bearings 6 and 7. Concentric with the rotor 5 is a stator winding 4. Driven equipment 8 is connected to the rotor 5 and is driven by the rotor 5 when electrical power is applied to the stator windings 4.

The monitoring system 1 includes an electronics module 2 comprising electronic circuitry for receiving sensor signals indicative of several operational parameters of the motor. The sensor signals are generated by several sensors that are attached to the motor, preferably at the time that the motor is manufactured. These sensors include a vibration sensor 30 for measuring motor vibration, a flux: sensor 33 for measuring magnetic flux generated by the motor, voltage sensors for measuring voltage applied to the stator winding 4 of the motor, and a stator winding insulation breakdown detector 52. The sensors also include an ambient temperature sensor 10a, a frame temperature sensor 10b, an inboard bearing temperature sensor 10c, an outboard bearing temperature sensor 10d, and a stator winding temperature sensor 10e. As explained below, the system uses signals from these sensors to determine the operational condition of the motor.

Figure 2:
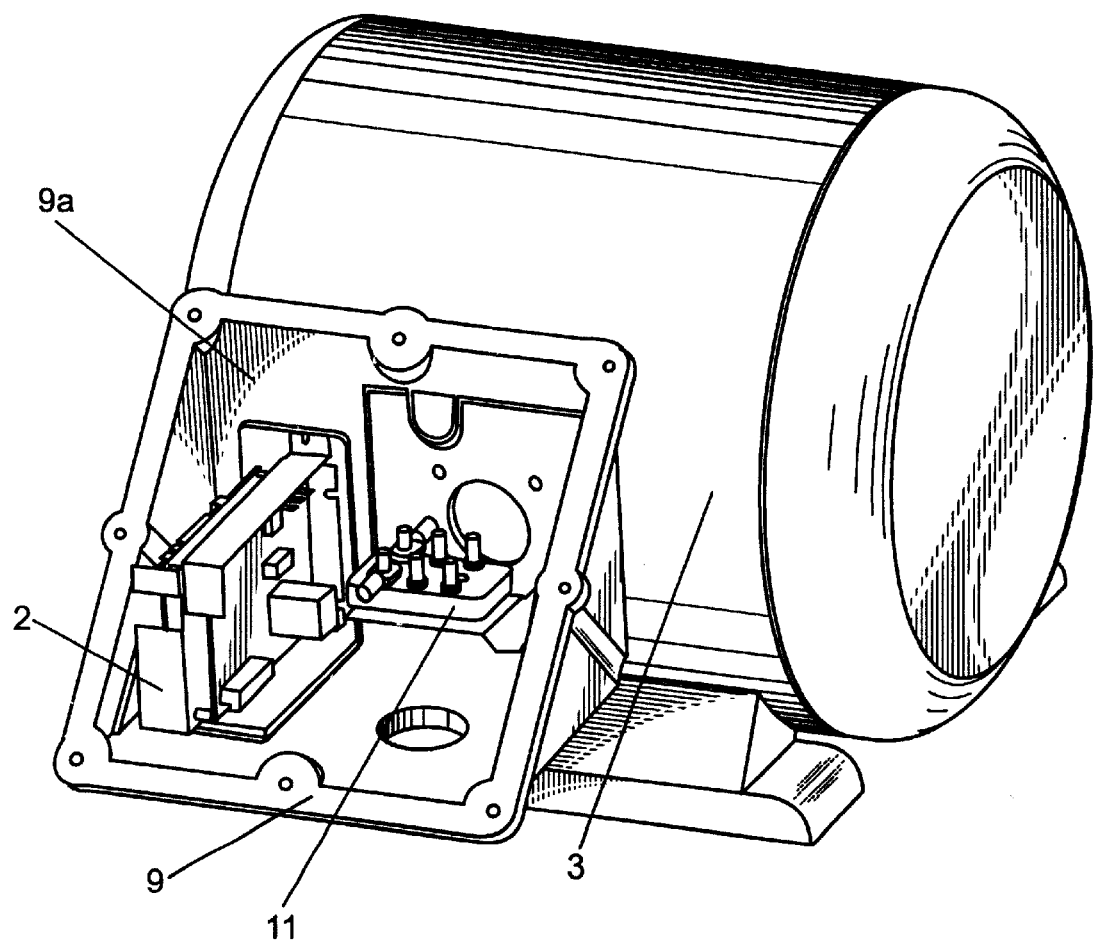
FIG. 2 is a perspective view of some mechanical features of the invention.

Shown in FIG. 2 is an isometric view of the motor frame 3. Attached to the motor frame 3 is a junction box 9 that houses the electronics module 2. A terminal block 11 within the junction box 9 provides an electrical connection point for three-phase voltage that powers the stator winding 4 and the electronics module 2.

Preferably, the temperature sensors 10a–e are 100 KΩ glass-encapsulated thermistors. These sensors 10a–e operate in a –40° to 180° C. temperature range, with an accuracy of ±20° C. at 180° C. and with better accuracy at lower temperatures. In the preferred embodiment of the invention, the ambient temperature sensor 10a is an epoxy-encapsulated thermistor having model number USP2471 manufactured by US Sensor Corp., which is mounted to an inner surface of the junction box 9. In such a position, the sensor 10a monitors an estimate of the ambient air temperature outside the motor frame 3. The frame temperature sensor 10b, which is affixed to a rear surface 9a of the junction box 9, is also preferably a ring-terminal-mounted epoxy-encapsulated thermistor having model number USP2471 manufactured by US Sensor Corp. Since the junction box rear surface is adjacent to the motor frame 3, this location provides a point for the sensor 10b to accurately measure the temperature of the motor frame 3. The bearing temperature sensors 10c and 10d are thermistors, such as part number USP1952 manufactured by US Sensors. These sensors 10c and 10d are mounted on the motor frame 3 immediately adjacent to the inboard and outboard motor bearings 6 and 7. The winding temperature sensor 10e is also a thermistor, such as part number USP1952 manufactured by US Sensors. The sensor 10e is embedded in the stator winding 4 to measure heat generated by the winding 4 as the motor operates.

Figure 3:
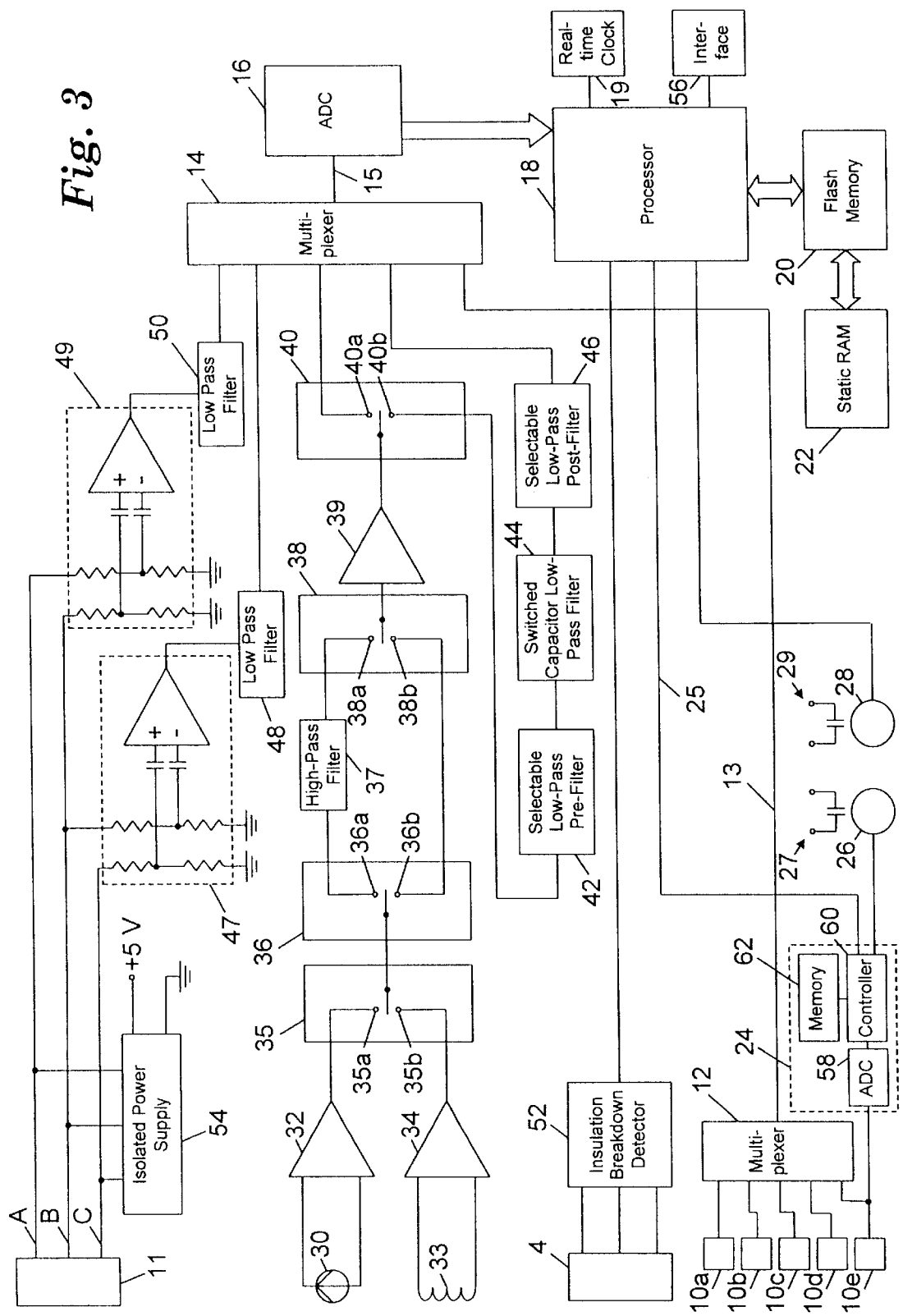
FIG. 3 is a functional block diagram of an integrated motor monitoring system.

As shown in the functional block diagram of FIG. 3, each of the temperature sensors 10a–10e is electrically connected to the input of a temperature signal multiplexer 12. The multiplexer 12, such as a chip having model number MAX4051 manufactured by Maxim, time multiplexes the five temperature signals from the five sensors 10a–10e into a composite temperature signal on a line 13.

The line 13 is connected to the input of a sensor signal multiplexer 14, such as a chip having model number MAX4051 manufactured by Maxim. The multiplexer 14 multiplexes the composite temperature signal with other sensor signals to form a composite sensor signal on a line 15.

The line 15 is connected to the analog input of an analog-to-digital converter (ADC) 16, such as model number LTC1418 manufactured by Linear Technologies. Preferably, the ADC 16 is a 14-bit unit that samples at 130,000 samples per second. The ADC 16 converts the analog composite sensor signal on the line 15 into a 14-bit digital composite sensor data signal that is transferred to a processor 18.

In a preferred embodiment, the processor 18, such as model number TMP53CS41F manufactured by Toshiba, provides 16-bit processing at a speed of about 14.7 MHZ. The processor 18 uses a 256 Kbyte flash memory 20 and a one Mbyte static random-access memory (SRAM) 22. The processor 18 executes a set of instructions, hereinafter referred to as firmware, to periodically access and process the sensor information contained within the digital sensor data signal. The length of time between sensor data acquisitions is determined, at least in part, by the time required for the processor 18 to perform the data acquisition, analysis, and storage tasks as described below. Preferably, the data acquisition interval is no greater than about two to five minutes.

In a preferred embodiment of the invention, the firmware executed by the processor 18 includes self-diagnostic routines that evaluate whether the sensors are functioning properly. Directed by the self-diagnostic routines, the processor 18 monitors the sensor information contained within the digital sensor data signal, and based on the sensor information determines whether the sensor signals indicate that a sensor has failed.

As described in more detail below, depending on the motor condition as indicated by the sensor data, the processor 18 may store the sensor data in the SRAM 22, and at times in the flash memory 20, for :later download. When appropriate, the processor 18 sends an annunciation signal to an annunciator 28 to indicate that a problem exists. For example, if the processor 18 determines, based on the digital composite sensor signal, that a bearing temperature, as sensed by sensor 10c or 10d, is greater than 120° C. for three or more consecutive data acquisition intervals, then the processor 18 ascertains that a "hazardous event" (HE) has occurred. Upon the occurrence of a HE, the processor 18 stores a full set of data to one of m number of HE data bins in the SRAM 22 along with a HE data flag that indicates the type of data stored. In the preferred embodiment, m is six. The processor 18 also triggers a HE alarm signal to activate the annunciator 28 at a particular alarm level. The annunciation function and alarm levels are described in greater detail hereinafter.

As described in more detail below, a full set of data includes high-frequency and low-frequency vibration data, high-frequency and low-frequency flux data, all of the temperature values, high-frequency detect (HFD) vibration data, and voltage measurements. A full set of data is stored for all HE parameters except "excessive winding temperature at start-up", for which a "special" winding temperature trend and in-rush flux trend are stored.

Continuing with the bearing temperature example, if the processor 18 determines that the excessive bearing temperature has increased by 5° C. or more during three or more consecutive acquisition intervals, a "delta change" HE has occurred, indicating that the problem is getting worse. In this situation, the processor 18 again stores a full set of data and a HE flag to the next available HE data bin in the SRAM 22. Also, the processor 18 again triggers the HE alarm signal to activate the annunciator 28. This process continues at subsequent data acquisition intervals until all of the HE data bins in the SRAM 22 are full. When the HE data bins are full, data storage continues as described hereinafter.

If the processor 18 determines that the previously excessive bearing temperature has dropped below the 120° C. limit for some period of time, say 30 minutes, the processor 18 will again trigger the HE alarm signal at the original alarm level. In this situation, the processor 18 also stores the sensor data in the next or appropriate HE data bin.

Hazardous events are described in Table I below.

TABLE I

| Hazardous Event | Threshold | Time over threshold | Delta Change | Priority Points | Alarm Level |
|---|---|---|---|---|---|
| Excessive winding temperature at start-up | >150° C. | 10 seconds after motor startup | not applicable | 20 | 1 |
| Loss of phase | zero volts on any phase voltage | two or more consecutive acquisition periods | zero volts for one hour | 15 | 2 |
| Excessive bearing temperature | >120° C. | three or more consecutive acquisition periods | 5° C. increase | 7 | 2 |
| Excessive winding temperature | >insulation threshold | three or more consecutive acquisition periods | 5° C. increase | 20 | 1 |
| Excessive temperature imbalance between front and rear bearings | >30° C. (for totally enclosed motors) | three or more consecutive acquisition periods | 5° C. increase | 7 | 2 |
| Excessive voltage | >5% of rated voltage | one hour | 0.5% increase | 4 | 2 |
| Excessive voltage imbalance | >150% of rated load | 30 minutes | excessive overload for 12 hours | 4 | 2 |
| Excessive overload | | | | | |
| Excessive overall vibration | >0.5 inch/second | one hour | 0.05 in/sec increase | 5 | 2 |
| Winding insulation breakdown | sensor triggered | ten minutes | not applicable | 2 | 2 |

In the preferred embodiment of the invention, the priority points as listed in Table I are used in prioritizing hazardous events as they occur. The total number of priority points for a HE, when it is comprised of more than one individual HE, is the sum of the priority points associated with each individual HE producing the hazardous event. For example, if there is a loss of phase and an excessive voltage imbalance, the total priority points for this hazardous event is 19 (15+4). With reference again to FIGS. 1 and 3, the system includes a vibration sensor 30 for sensing motor vibration. In the preferred embodiment, the sensor 30 is an accelerometer, such as a model number 603M15 manufactured by IMI, operating over a 0.32 Hz–10 KHz frequency range. Preferably, the vibration sensor 30 is mounted in the junction box 9. The vibration signal at the output of the sensor 30 is amplified and integrated by an accelerometer amplifier/integrator 32.

The system also includes a flux sensor 33 for sensing the magnetic flux generated by the motor and for producing a flux signal based on the motor's magnetic flux. In the preferred embodiment, the flux sensor 33 is a wire coil consisting of 50 turns of #22 gauge bondable copper wire. The inside diameter of the coil is preferably 10 inches, although the size of the coil will vary depending on the size of the motor. The estimated cross-section of the coil is 0.25 inch square. Preferably, the flux coil 33 is mounted at one end of the interior of the motor frame 3, concentric with the rotor 5 and the stator winding 4. The flux sensor 33 is connected to a flux signal amplifier 34 that increases the level of the flux signal.

As shown in FIG. 3, the output of the accelerometer amplifier/integrator 32 is connected to a contact 35a of a switch 35, and the output of the flux signal amplifier 34 is connected to a contact 35b of the switch 35. The state of the switch 35 is controlled by the processor 18 according to the is firmware instructions. Depending on the state of the switch 35, either the flux signal or the vibration signal is processed by the filter and amplifier circuit described below.

The switches 36, 38 and 40, which are also controlled by the processor 18 according to the firmware instructions, route the selected sensor signal (flux or vibration) through either a high-pass (HP) filter/amplifier circuit or through a low-pass (LP) filter/amplifier circuit. For the HP route, the processor 18 sets the switch 36 to contact 36a, the switch 38 to contact 38a, and the switch 40 contact 40a. These settings route the, selected sensor signal (flux or vibration) through a fixed HP filter 37 and the amplifier 39 to an input to the sensor signal multiplexer 14. For the LP route, the processor 18 sets the switch 36 to contact 36b, the switch 38 to contact 38b, and the switch 40 to contact 40b. These switch settings route the selected sensor signal through the amplifier 39, a selectable LP pre-filter 42, a switched-capacitor LP filter 44, and a selectable LP post-filter 46 to another input to the sensor signal multiplexer 14.

With continued reference to FIG. 3, a voltage sensor 47, mounted on a power supply board of the electronics module 2 within the junction box 9, is connected across the B-C phase voltage of the three-phase power applied to the motor winding 4. The voltage sensor 47 measures the B-C phase voltage and generates a voltage sensor signal that is compatible with the other sensor signals at the input to the sensor multiplexer 14. In the preferred embodiment, the voltage sensor 47 includes a voltage-divider network connected between each phase and ground. The voltage across the low side of each voltage-divider is passed through a differential amplifier, as shown in FIG. 3. A voltage sensor 49, which is preferably identical to the sensor 47, is connected across the A-B phase voltage of the three-phase power applied to the motor winding 4. The voltage signals from the voltage sensors 47 and 49 are hereinafter referred to as the B-C voltage signal and the A-B voltage signal, respectively. Fixed LP filters 48 and 50 condition the voltage signals for further processing. The outputs of the LP filters 48 and 50 are connected to inputs of the sensor signal multiplexer 14.

As mentioned previously, the output of the multiplexer 14 is a time-multiplexed composite sensor signal on the line 15. This composite sensor signal includes the vibration signal, flux signal, A-B and B-C phase voltage signals, and the composite temperature signal.

In a preferred embodiment, the system includes circuitry for continuous monitoring of the stator winding temperature, referred to hereinafter as the continuous winding temperature monitor (CWTM) 24. The CWTM 24, such as a chip having model number PIC16C711 manufactured by Microchip Technology, Inc., receives the winding temperature signal from the winding temperature sensor 10e, and continuously monitors the winding temperature signal for an indication of an abnormal condition. Preferably, as shown in FIG. 3, the CWTM 24 includes an analog-to-digital converter 58 for converting the analog winding temperature signal from the winding temperature sensor 10e into a digital winding temperature signal. A controller 60 receives the digital winding temperature signal and compares it to a programmable threshold level that is stored in the memory 62. As indicated in Table I, the preferred threshold level is 150° C. during start-up and the rated so winding insulation temperature otherwise When the winding temperature exceeds the threshold, after storage of the appropriate data, the CWTM controller 60 activates the annunciator 26. Preferably, the annunciator 26 is a relay that, when activated, closes a set of relay contacts 27. The relay contacts 27 are designed to be connected to an annunciation circuit, such as an indicator light or an audible alarm. Thus, when the relay contacts 27 close, the annunciation circuit is activated. In the preferred embodiment, activation of the annunciator 26 by a winding over-temperature condition indicates a level one alarm, which signifies a serious motor problem.

As one skilled in the art appreciates, the stator winding temperature is a critical monitoring parameter. If monitoring personnel had to choose only one parameter to monitor, it would be the winding temperature. Thus, by incorporating the CWTM 24, the invention provides redundancy in the monitoring of the stator winding temperature. If the processor 18 were to fail for any reason, the CWTM 24 could still be operable to activate the annunciator 26 if the winding temperature exceeded its threshold.

As shown in Table I, an excessive winding temperature at start-up generates a level one alarm. If the winding temperature signal indicates that the winding temperature has exceeded 150° C. for 10 seconds during motor startup, then data is stored by the processor 18 and the CWTM 24 activates the annunciator 26. One reason for a sudden rise in winding temperature at start-up is that the rotor 5 is locked.

The CWTM 24 also monitors the length of time during which the winding temperature exceeds the threshold level. Preferably, if the winding temperature exceeds the threshold for more than three data acquisition intervals, then the CWTM controller 60 sends an over-temperature indication signal to the processor 18 on the line 25. The processor 18 then acquires and stores a full set of data according to a process shown in FIG. 5 and described in more detail below.

With continued reference to FIG. 3, the system includes a stator winding insulation breakdown detector 52 that monitors the integrity of the insulation on the wire that forms the stator winding. An example of such an insulation breakdown detector is described in U.S. Pat. No. 6,087,836, entitled "Apparatus for and Method of Monitoring the Status of the Insulation of the Wire in a Winding", filed Nov. 18, 1997, the disclosure of which is hereby incorporated by reference.

Figure 4:
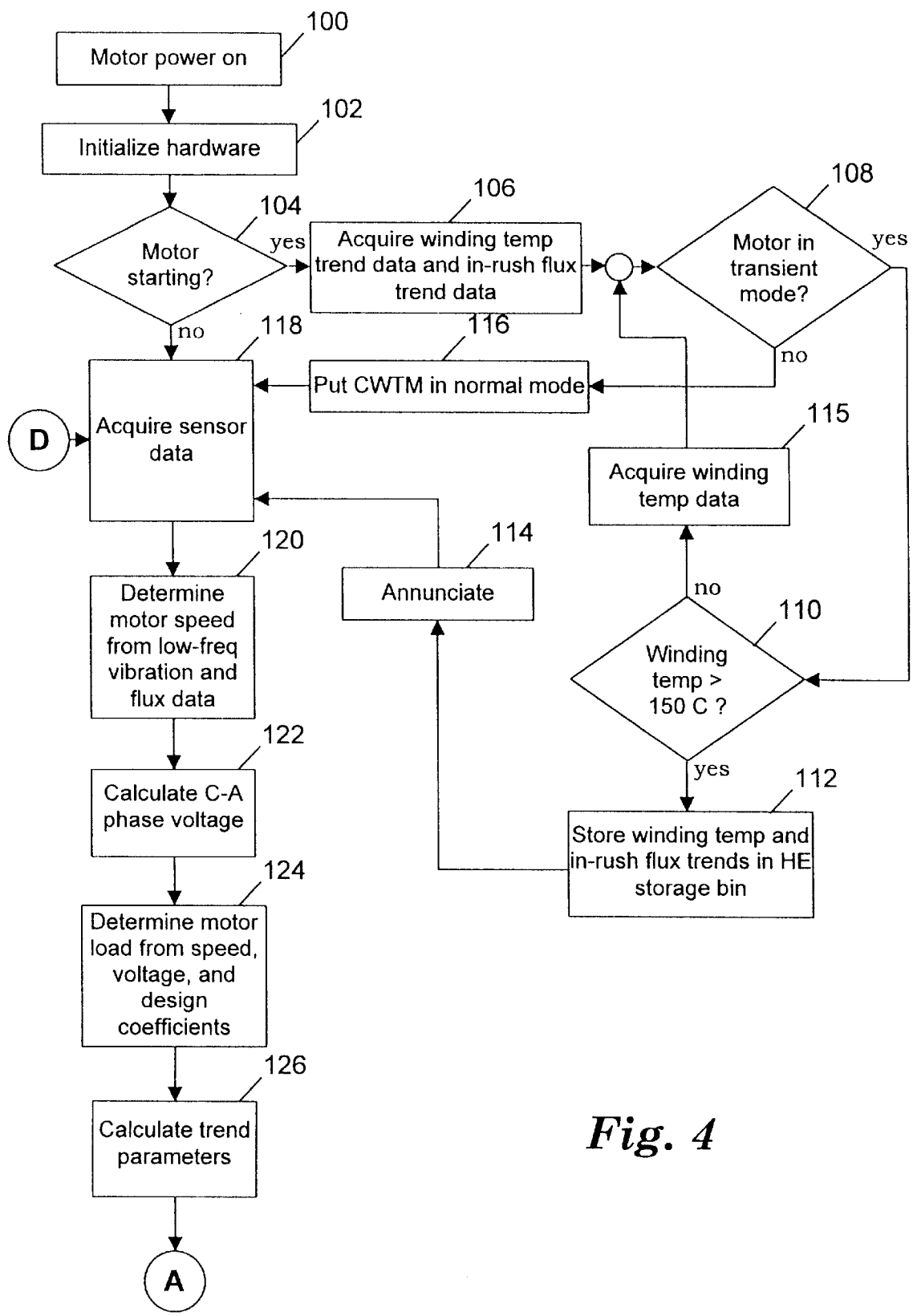
FIG. 4 is a flow diagram illustrating general data acquisition processing and hazardous event processing according to the invention.
Figure 5A:
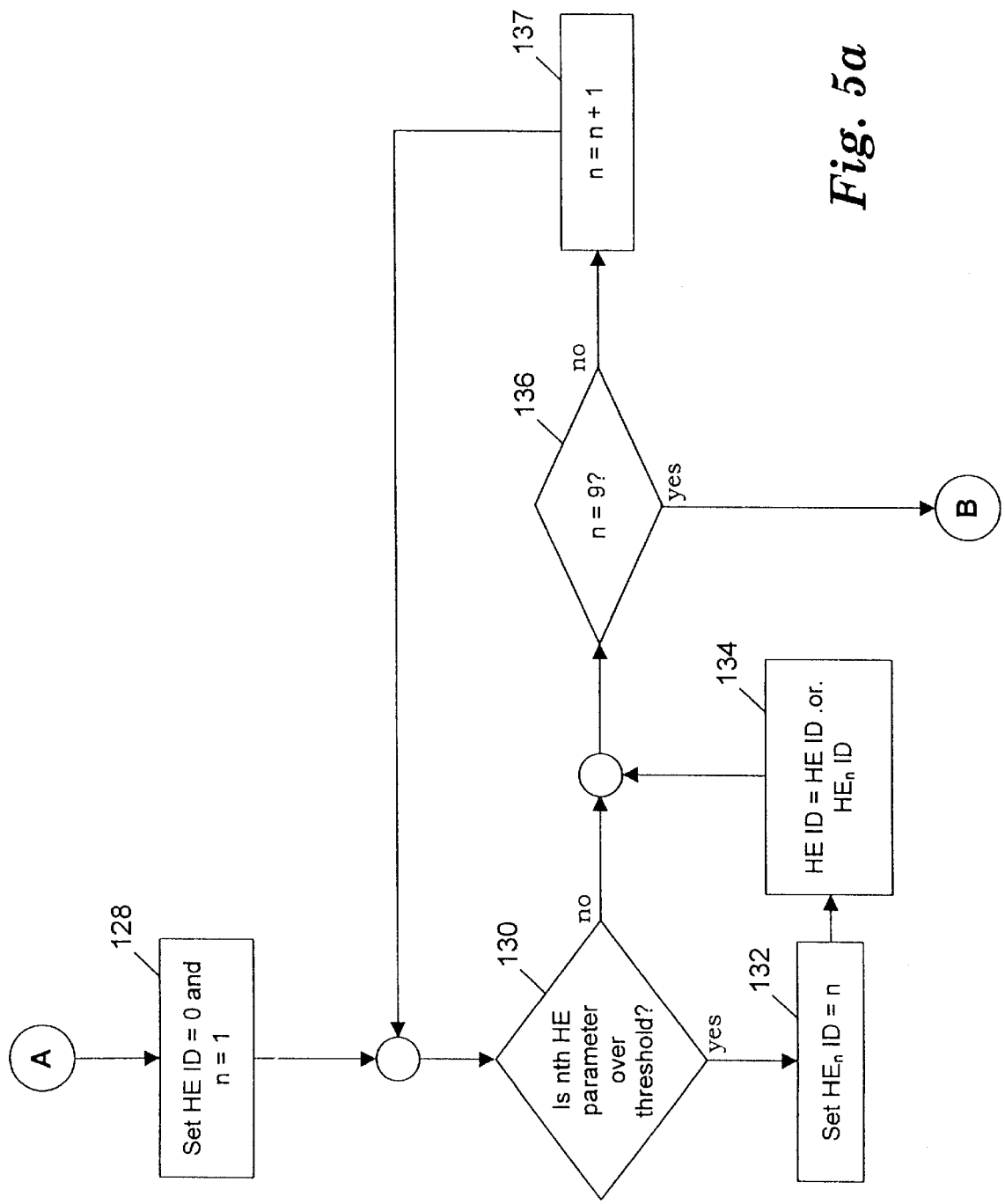
FIGS. 5a–5c are flow diagrams illustrating hazardous event processing according to the invention.
Figure 5B:
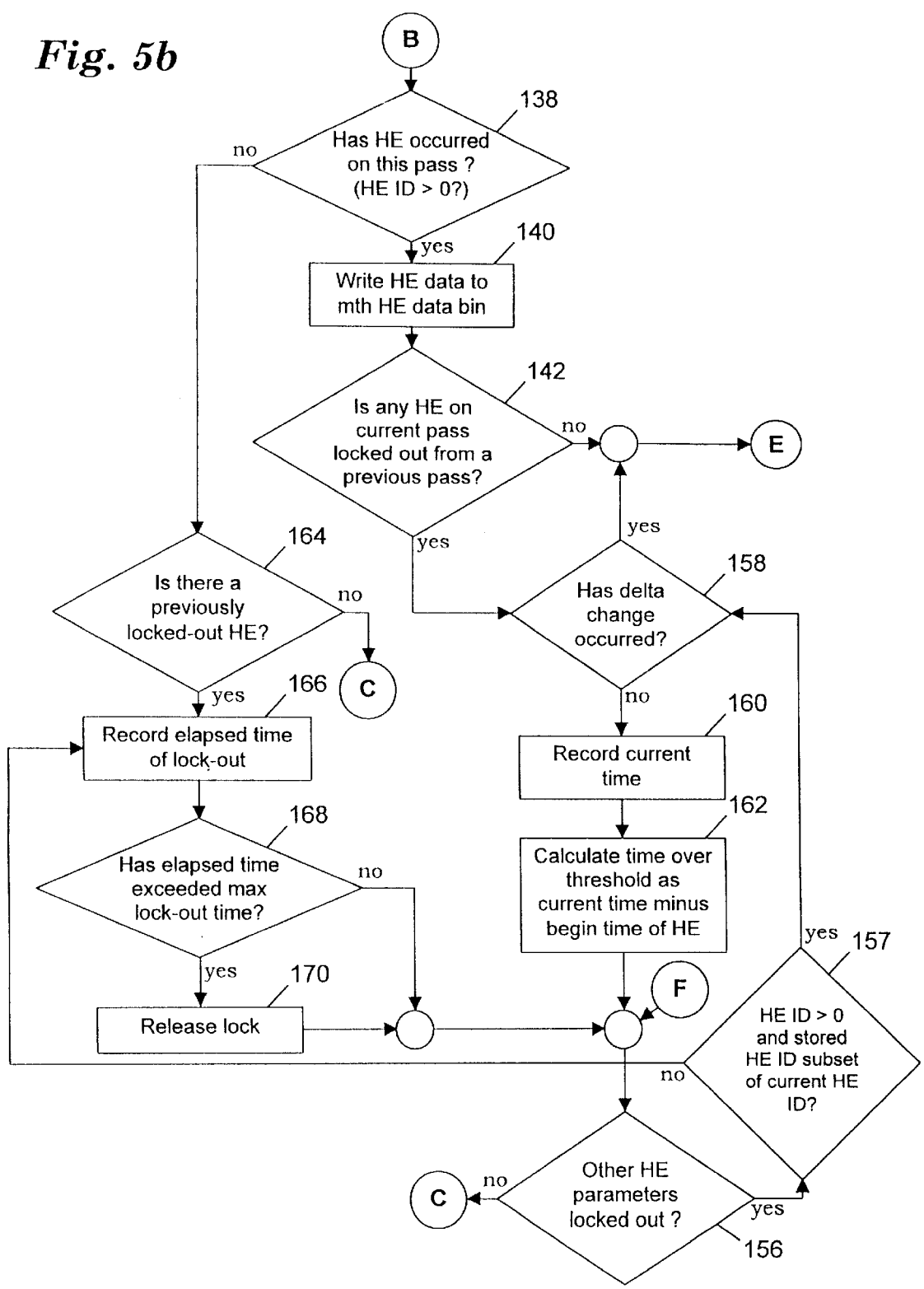
Figure 5C:
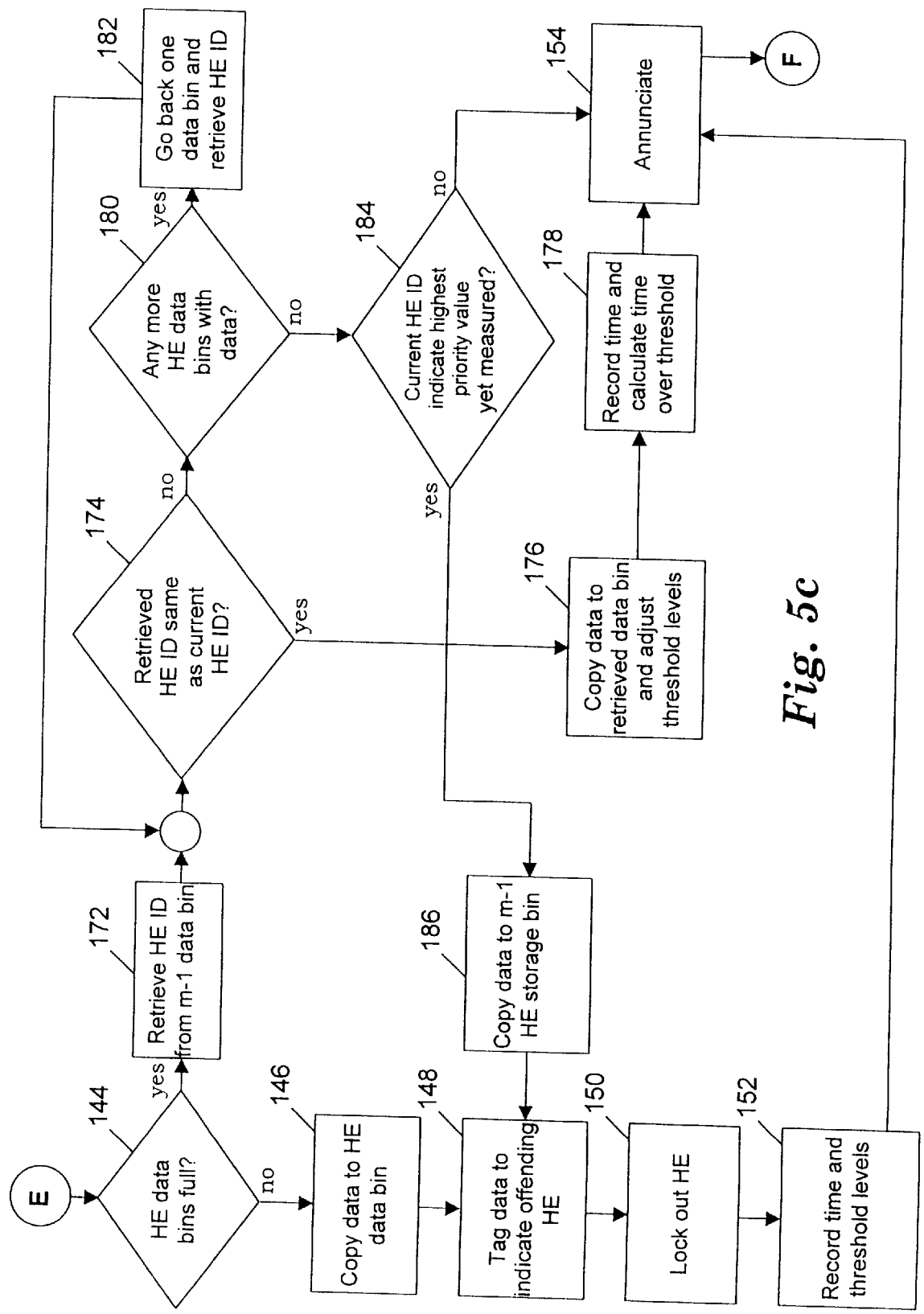
Figure 6:
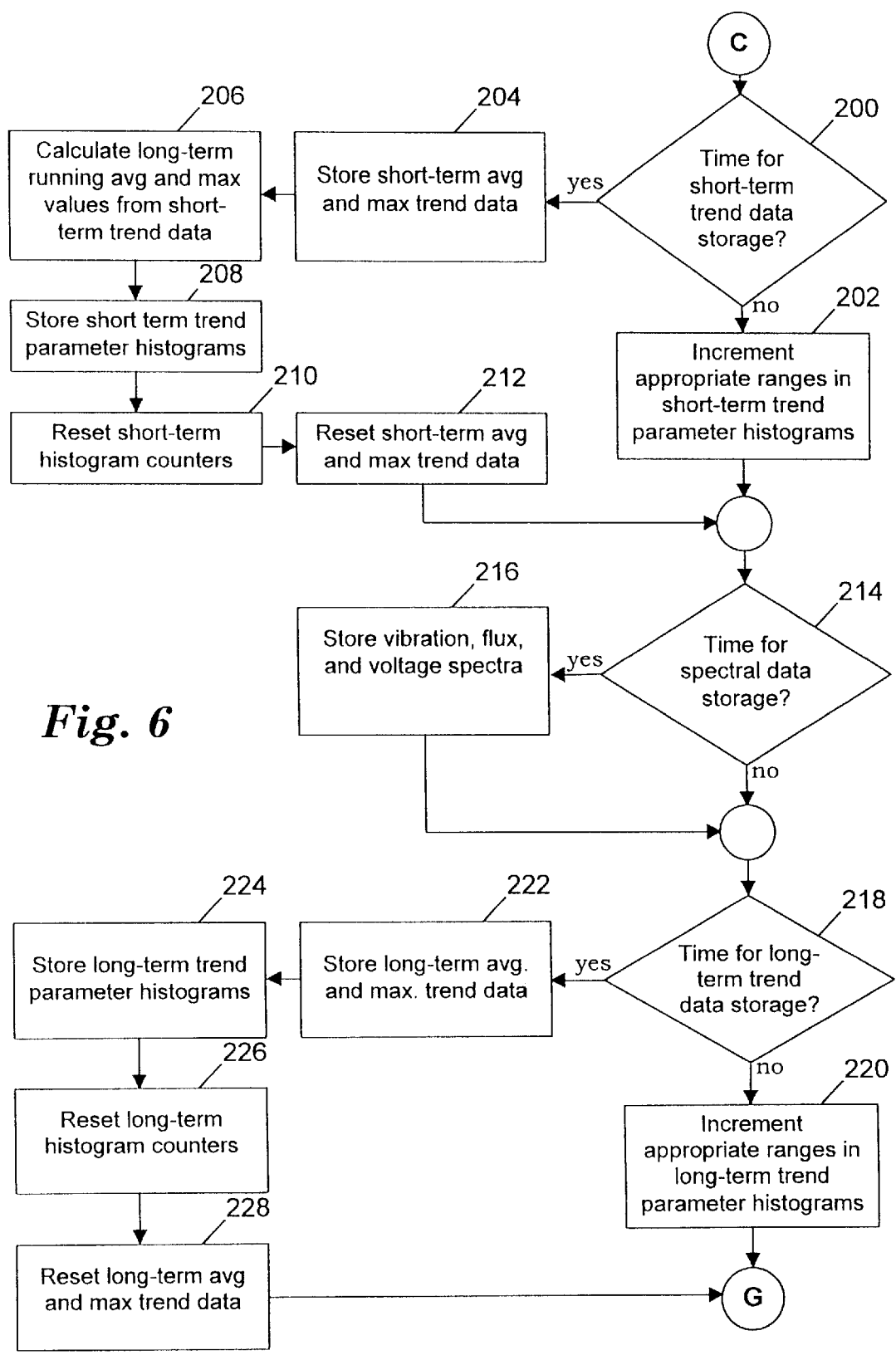
FIG. 6 is a flow diagram illustrating general data acquisition processing according to the invention.

As illustrated in the flow charts of FIGS. 4–7, the processor 18 executes firmware instructions to acquire, analyze, and store the sensor information contained in the composite sensor signal. These tasks are broken down into hazardous event processing, general data acquisition processing, prognostic processing, and diagnostic processing. Hazardous event processing is illustrated in the flow charts of FIGS. 4, 5a, 5b, and 5c. General data acquisition processing is illustrated in FIG. 6. Prognostic processing is illustrated in FIG. 7a, and diagnostic processing is illustrated in FIG. 7b.

As shown in FIG. 4, when power is applied to the motor (step 100), the system hardware is initialized (step 102). The processor 18 then determines whether the motor is in start-up mode (step 104). If the motor is in start-up mode, the processor 18 acquires stator winding temperature data from the CWTM 24 and in-rush flux trend data (step 106). If the motor is in transient mode (step 108) and the stator winding temperature sensed by the CWTM 24 is greater than 150° C. (step 110), the processor 18 saves the winding temperature data to a HE data bin in the SRAM 22 (step 112). In this situation, the in-rush flux trend data is also stored. The processor 18 then sends a pulse to the annunciator (step 114) to indicate that a problem exists.

If the motor is in transient mode (step 108) and the stator winding temperature sensed by the CWTM 24 is not greater than 150° C. (step 110), then the processor 18 again acquires winding temperature data (step 115) and determines whether the motor is still in transient mode (step 108).

If the motor is not in transient mode (step 108), the processor 18 sends a command to the CWTM 24 to put it in normal mode (step 116) wherein the winding temperature threshold corresponds to the rated winding insulation temperature. The processor 18 then proceeds to acquire sensor data (step 118) as described in more detail below.

If the motor is not in start-up mode (step 104), the processor 18 acquires sensor data from the composite digital sensor signal at the output of the ADC 16 (step 118). At this point, the processor 18 acquires samples of data from each sensor signal, including all of the temperature signals, the vibration signal, the flux signal, and the two voltage signals. As described in detail below, the processor 18 calculates trend parameters based on these data samples, and determines whether any of the sensor signals indicate the occurrence of any of the hazardous events in Table I.

Prior to determining whether an overload hazardous event has occurred, the processor 18 calculates the motor speed and percent load based on the sensor signals. At step 120, the motor speed is determined based upon vibration near the line frequency (LF) and low-frequency flux data. Preferred methods of determining motor speed from vibration and flux data are disclosed in pending U.S. Pat. No. 6,087,796, filed Jun. 16, 1998, and entitled METHOD & APPARATUS FOR DETERMINING ELECTRIC MOTOR SPEED USING VIBRATION AND FLUX, the entire contents of which are expressly incorporated herein by reference.

Based on the A-B phase voltage and the B-C phase voltage acquired from the voltage sensors 47 and 49, the processor 18 calculates the C-A phase voltage (step 122). The processor 18 then determines a motor percent load (step 124) using the calculated motor speed, an average of the measured A-B phase voltage, the measured B-C phase voltage, and the calculated C-A phase voltage (hereinafter referred to as the average voltage), and motor design coefficients provided by the motor manufacturer. Preferably, the motor load factor is determined based on a polynomial regression model of motor load as a function of speed, average voltage, and design coefficients. The processor 18 then calculates a set of trend parameters (step 126), which are listed in Table V and discussed in more detail hereinafter. These calculated values include a running average and a maximum value for each trend parameter. The average and maximum values of each trend parameter are stored for each data acquisition interval as defined hereinafter.

The processor 18 next determines whether a hazardous event (HE) has occurred by comparing the measured sensor data and the calculated motor percent load against the HE parameter limits shown in Table I. As shown in FIG. 5a, when any one of the nine HE parameters exceeds its corresponding threshold at any given time, a HE flag, referred to herein as HE ID, is set to a value that reflects which of the HE parameters exceed their limits. If more than one HE parameter is over its threshold at a given time, it is recorded as a single HE, but is comprised of multiple HE parameters. First, HE ID is set to zero and a counter value, n, is set to one (step 128). If the first HE parameter, referred to hereinafter as HE$_n$ is over its threshold (step 130–see Table I), then a value HE$_n$ ID is set to equal n (step 132). HE ID is then set to equal the logical OR of HE ID and HE$_n$ ID (step 134). If n does not equal nine (step 136), n is incremented (step 137), and the next HE parameter is checked (step 130). This sequence repeats until all nine HE parameters have been checked. At the completion of the operation shown in FIG. 5a, the value of the flag HE ID indicates all of the HE parameters that are over their alarm threshold. The HE ID value also indicates the total priority points value based on all of the HE parameters that are over their alarm threshold for the current data acquisition interval.

If any HE parameter is over its threshold (step 138), then the HE data is stored in the mth data bin of the m number of data bins in the SRAM 22 (step 140). As discussed in more detail below, under certain conditions, HE parameters may be locked out from alarm, such that, even though the HE parameter is over its threshold, an alarm is not activated. If any HE parameter that is over its threshold on the current pass is not locked out from alarm (step 142), then processing advances to step 144 in FIG. 5c.

With reference to FIG. 5c, if the m−1 number of HE data bins are not full (step 144), then the HE parameter data is copied to an available HE data bin in the SRAM 22 (step 146), and the data is tagged to indicate the HE parameter that is over threshold (step 148). The offending HE parameter is then locked out from alarm (step 150), the time and threshold level for the parameter is recorded (step 152), and the processor 18 sends a pulse to activate the annunciator 26 for a level 1 alarm or the annunciator 28 for a level 2 alarm (step 154). The processing then advances to step 156 in FIG. 5b.

Preferably, the annunciator 28, shown in FIG. 3, is a relay that, when activated, closes a set of relay contacts 29. The relay contacts 29 are designed to be connected to an annunciation circuit, such as an indicator light or an audible alarm. Thus, when the relay contacts 29 close, the annunciation circuit is activated. Preferably, the activation of the annunciator 28 indicates a level two alarm which signifies a less severe motor fault condition than a level one alarm.

As shown in FIG. 5b, if any HE parameter had been locked out of alarm on a previous pass (steps 142 or 156), then the processor 18 determines whether an HE has occurred during the current pass (HE ID>0) and whether the locked-out HE parameter is a subset of the current HE parameter (step 157). If so, the processor 18 determines whether a delta change has occurred in the measured value of the locked-out parameter since the previous pass (step 158). The delta change conditions for the HE parameters are listed in Table I. If a delta change has not occurred in the measured value of the HE parameter under consideration, then the current time is recorded (step 160) and the time-over-threshold for the HE parameter is calculated (step 162). If a delta change has occurred in the measured value of the HE parameter (step 158), and the HE data bins are not full (step 144 of FIG. 5c), then steps 146–154 of FIG. 5c are repeated. The processing of steps 156–162 of FIG. 5b and steps 144–154 of FIG. 5c are repeated until all of the previously locked-out HE parameters have been considered.

If the determination at step 157 is no, or if no HE parameter is over its threshold on the current pass (step 138), then the processor 18 determines whether there are any HE parameters locked out from alarm from a previous pass (step 164). If any HE parameter is locked out from a previous pass, then elapsed time since the HE parameter was locked out is recorded (step 166). If the elapsed time in lock-out exceeds a maximum lock-out time (step 168), such as 30 minutes, then the lock-out is released (step 170). If the elapsed time in lock-out has not exceeded a maximum lock-out time (step 168), then the lock-out is not released. In either case, processing continues at step 156 for any remaining HE parameters that are locked out from alarm.

If there are no further locked-out parameters (steps 164 or 156), then HE processing is complete and the processor 18 begins the general data acquisition processing of FIG. 6.

With reference again to FIG. 5c, if the m−1 number of HE data bins are full (step 144), then the HE ID stored in the m−1 data bin is retrieved (step 172). If the HE ID value retrieved from the m−1 data bin is the same as the current HE ID value (step 174), then the latest HE parameter data is stored in the just-retrieved data bin and the HE parameter threshold level is adjusted accordingly (step 176). The processor 18 then records the current time, calculates the time-over-threshold for the HE parameter (step 178), sends a pulse to activate the annunciator 26 for a level 1 alarm or the annunciator 28 for a level 2 alarm (step 154), and continues processing at step 156 in FIG. 5b.

If the HE ID value retrieved from the m-1 data bin is not the same as the current HE ID value (step 174), then the processor 18 determines whether any of the other HE data bins are occupied (step 180). If so, the processor 18 retrieves the HE ID stored in the m−2 data bin and the processing repeats beginning at step 174. This continues until all of the occupied HE data bins have been processed.

After processing all of the occupied HE data bins (step 180), the processor 18 determines whether the current HE ID indicates the highest number of priority points of all the HE ID values stored in the occupied data bins (step 184). If the current HE ID has the highest number of priority points, the data is stored in the m−1 HE data bin (step 186) and processing continues at step 148. Thus, the HE parameter data stored in the m−1 data bin is always the worst-case (highest priority) value. If the current HE parameter value is not a worst-case value (step 184), then the processor 18 sends a pulse to activate the annunciator 26 for a level 1 alarm or the annunciator 28 for a level 2 alarm (step 154), and processing continues at step 156 in FIG. 5b.

In an alternative embodiment of the invention, the system 1 also monitors characteristics that are indicative of the operational condition of the driven equipment 8 and the type of coupling 17 between the driven equipment 8 and the motor. For example, if the driven equipment 8 is a pump, there may be vibrational frequencies associated with the pump that may be distinguished from vibrational frequencies of the motor. Such vibration, which is characteristic of the driven equipment 8, is transmitted to the motor through the coupling 17 and may be detected by the vibration sensor 30. By measuring the vibration level at these frequencies that are characteristic of the driven equipment 8, the system 1 can detect when the driven equipment 8 develops a problem. In a similar manner, the operational condition of the coupling 17 may also be ascertained by monitoring vibrational frequencies that are associated with the coupling 17.

In this alternative embodiment, in addition to the hazardous events listed in Table I, hazardous events would also be defined for vibration thresholds of frequencies associated with the driven equipment 8 and the coupling 17. Since different types of driven equipment 8 and coupling 17 may have different characteristic vibrational frequencies and thresholds, the preferred embodiment of the invention stores information in the SRAM 22 indicating the type of driven equipment 8 and type of coupling 17. Preferably, this information is stored as coupling information and driven equipment information which the user inputs via the communications interface 56 as described below. Based on the driven equipment information and the coupling information, the processor 18 accesses corresponding vibrational frequencies and thresholds stored in a lookup table in the memory 20. Thus, using the lookup table and the driven equipment and coupling information, the hazardous event processing may be customized for the particular driven equipment 8 and coupling 17.

After completion of HE processing, the processor 18 performs the general data acquisition processing tasks as shown in FIG. 6, including short- and long-term trend data storage. Preferably, the one-Mbyte SRAM 22 accommodates 180 short-term and 60 long-term storage locations that are utilized on a user-selectable storage schedule. Table II lists a set of options for short- and long-term data storage intervals, along with the storage capacity for each option. The preferred storage intervals for general data acquisition processing are 24 hours (short-term) and 30 days (long-term).

TABLE II

| Interval | Short Term | | Long Term | |
|---|---|---|---|---|
| | Storage Interval | Capacity | Storage Interval | Capacity |
| Recommended | 24 hours | 180 days | 30 days | 60 months |
| Monthly | 4 hours | 30 days | 6 days | 12 months |
| Weekly | 1 hour | 7 days | 12 hours | 1 month |
| Daily | 8 minutes | 1 day | 2.8 hours | 7 days |
| Rapid | Each acquisition | 180 times acquisition time | 18 times acquisition time | 1080 times acquisition time |

Referring again to FIG. 4, after each sensor data acquisition interval (step 118), the trend parameters listed in Table V are calculated (step 126). In the preferred embodiment of the invention, the processor 18 calculates an average of each of the measured trend parameter values over each data storage interval. This average for each trend parameter, and the maximum value measured during the storage interval, are stored according to the sequence shown in FIG. 6.

As shown in FIG. 6, the processor 18 determines whether the storage interval time has elapsed since the most recent short-term data storage (step 200). In the preferred embodiment of the invention, if the short-term data storage interval has not elapsed, the processor 18 determines into which of ten ranges that six of the calculated trend parameter values fall for the current data acquisition interval. These six trend parameters and their corresponding ten ranges are listed in Table III. The processor 18 then increments a counter for each of those trend parameter ranges (step 202) in which the trend parameter values fell. The ten counter values comprise a short-term trend parameter histogram.

Figure 8:
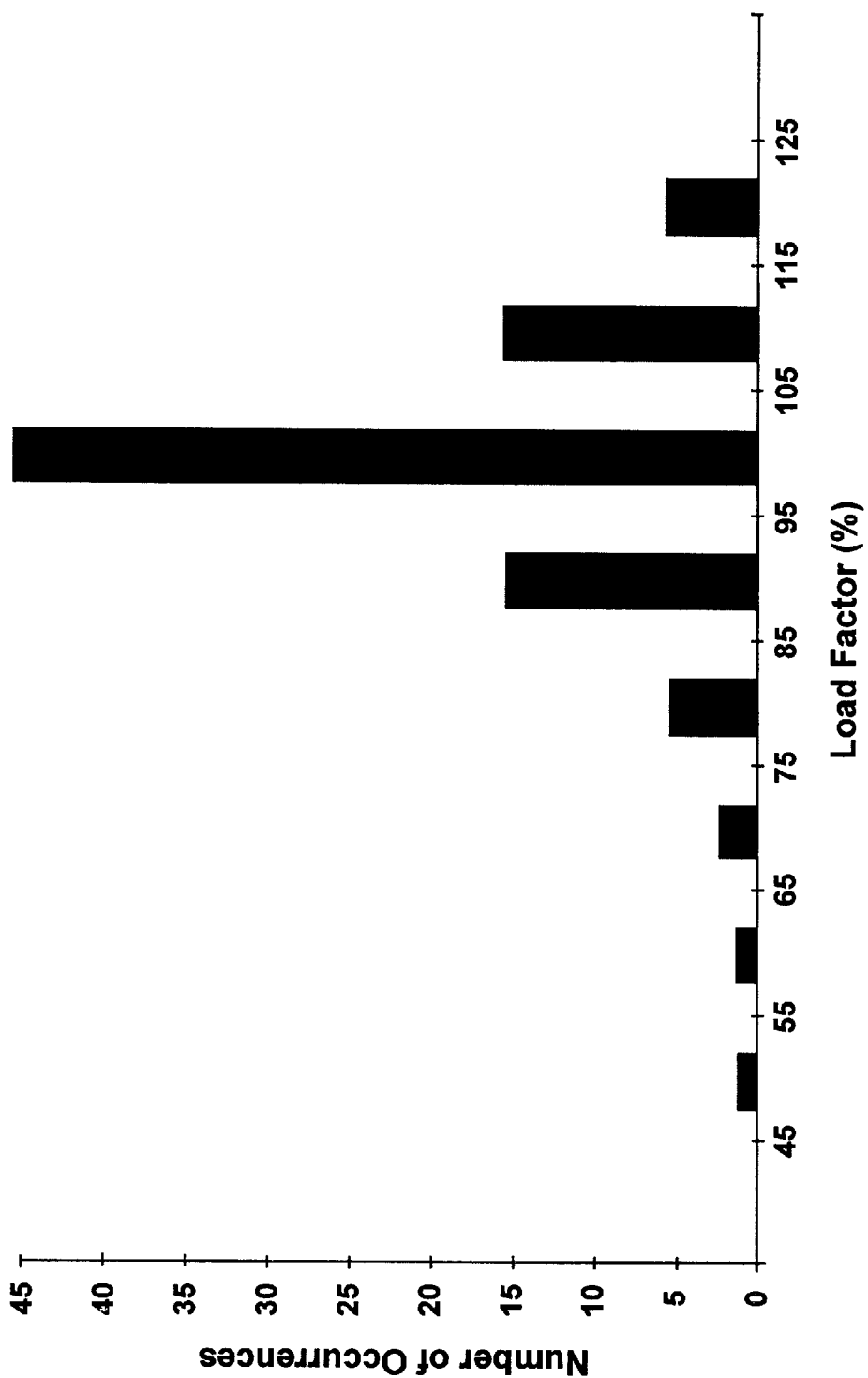
FIG. 8 is an example of a motor load factor histogram.

An exemplary short-term histogram for percent load is shown in FIG. 8. For example, referring to FIG. 8, if the calculated percent load for the current data acquisition interval is 93%, it would fall into the 85–95% load range in the histogram. Thus, the processor 18 increments a counter corresponding to that percent load range.

TABLE III

| Histogram Bin No. | Overall Vibration (in/sec) | Total Flux (Flux AU) [1] | Voltage Imbalance (%) [2] | Load (%) [3] | Bearing Temp. Diff. (° C.) [4] | Stator Temp. (° C.) [5] |
|---|---|---|---|---|---|---|
| 0 | <0.0 | <0.2 × FV | <0.5 | <45 | <ET − 100 | <IC − 65 |
| 1 | 0.1 to 0.2 | 0.2 × FV to 0.4 × FV | 0.5 to 1.0 | 45 to 55 | ET − 100 to ET − 20 | IC − 65 to IC − 55 |
| 2 | 0.2 to 0.25 | 0.4 × FV to 0.6 × FV | 1.0 to 1.5 | 55 to 65 | ET − 20 to ET − 15 | IC − 55 to IC − 45 |
| 3 | 0.25 to 0.3 | 0.6 × FV to 0.8 × FV | 1.5 to 2.0 | 65 to 75 | ET − 15 to ET − 10 | IC − 45 to IC − 35 |
| 4 | 0.3 to 0.35 | 0.8 × FV to 1.0 × FV | 2.0 to 2.5 | 75 to 85 | ET − 10 to ET − 5 | IC − 35 to IC − 25 |
| 5 | 0.35 to 0.4 | 1.0 × FV to 1.2 × FV | 2.5 to 3.0 | 85 to 95 | ET − 5 to ET | IC − 25 to IC − 15 |
| 6 | 0.4 to 0.45 | 1.2 × FV to 1.4 × FV | 3.0 to 3.5 | 95 to 105 | ET to ET + 5 | IC − 15 to IC − 5 |
| 7 | 0.45 to 0.5 | 1.4 × FV to | 3.5 to 4.0 | 105 to 115 | ET + 5 to ET + 10 | IC − 5 to IC + 5 |

TABLE III-continued

| Histogram Bin No. | Overall Vibration (in/sec) | Total Flux (Flux AU) [1] | Voltage Imbalance (%) [2] | Load (%) [3] | Bearing Temp. Diff. (° C.) [4] | Stator Temp. (° C.) [5] |
|---|---|---|---|---|---|---|
| 8 | 0.5 to 0.75 | 1.6 × FV 1.6 × FV to 1.8 × FV | 4.0 to 4.5 | 115 to 125 | ET + 10 to ET + 15 | IC + 5 to IC + 15 |
| 9 | >0.75 | >1.8 × FV | >4.5 | >125 | ET + 15 to ET + 20 | >IC + 15 |

[1] FV = Flux value (RMS) of the reference point, where the reference point is the first overall value of the flux measurement taken on a new or rebuilt motor.
[2] Voltage imbalance (%) - 100 × (maximum voltage deviation from average)/(average voltage)
[3] Percent load is calculated based on the speed and voltage of the motor.
[4] Bearing temperature difference is defined as temperature of inboard bearing minus temperature of outboard bearing, where ET = 30° C. for totally enclosed motors and ET = 0° C. for open motors.
[5] IC is rated temperature of the winding insulation class as listed below:
Insulation class A = 95° C.
Insulation class B = 130° C.
Insulation class F = 155° C.
Insulation class H = 180° C.
Insulation class N = 200° C.

If the processor 18 determines at step 200 that the storage interval time has elapsed since the most recent short-term trend data storage, the processor 18 processes and stores the average and maximum values of all of the trend parameters listed in Table V over the short-term storage interval (step 204). The processor 18 then calculates a long-term running average and long-term maximum value based on the short-term trend data (step 206). At this time, the processor 18 also stores the six short-term trend parameter histograms (step 208), resets the short-term histogram counters (step 210), and resets the short-term average and maximum trend data values (step 212).

At six equally-spaced intervals over the short-term capacity interval (see Table II), the processor 18 stores high-frequency and low-frequency vibration spectra, high-frequency and low-frequency flux spectra, and an average voltage spectrum according to Table IV (steps 214 and 216). The processor 18 generates these spectra based on the time-domain vibration and flux sensor signals using Fast Fourier Transform (FFT) processing. In the preferred embodiment, each stored spectrum is an average of four measured spectra. This data is stored in a six-bin short-term FIFO buffer within the SRAM 22 (step 216).

TABLE IV

| Measurement Type | | Two Pole Motor | Four Pole Motor | Six or More Pole |
|---|---|---|---|---|
| Vibration | Low Frequency | 0.25–200 Hz, 1600 lines | | |
| | High Frequency | 2.25–3600 Hz, 3200 lines | 1.5–2400 Hz, 3200 lines | |
| Flux | Low Frequency | 0.125–200 Hz, 3200 lines | 1.10–150 Hz, 3200 lines | 0.09–144 Hz, 3200 lines |
| | High Frequency | 2.25–3600 Hz, 3200 lines | 1.5–2400 Hz, 3200 lines | |
| Voltage | | 7.5–3000 Hz, 800 lines | | |

In a preferred embodiment, in addition to the trend parameters listed in Table V, the system 1 also stores diagnostic parameters indicative of the operational condition of the driven equipment 8 and the type of coupling 17 between the driven equipment 8 and the motor. For example, the diagnostic data may include vibration levels at specific frequencies associated with the driven equipment 8 and coupling 17. By periodically storing such vibration levels, the system I provides information that maintenance personnel can use to differentiate motor problems from driven equipment and coupling problems. Further, this information can be used to some extent to diagnose the condition of the driven equipment 8 and coupling 17 over time.

TABLE V

| Vibration | Flux | Temperature | Voltage | Environment |
|---|---|---|---|---|
| overall (0–2500 Hz) | total flux | ambient | voltage average | speed |
| sub-harmonics | rotor bar (LF ± NP × SF) | frame | voltage balance | load |
| 1 × RPM | stator (LF ± n × RPS) | heating (frame-ambient) | harmonic distortion | acceleration time |
| 2 × RPM | line frequency | inboard bearing | | run time |
| middle synchronous (3 × RPM to 8 × RPM) | slot pass frequency (2 × LF family) | outboard bearing | | starts |
| upper synchronous (9 × RPM to 50 × RPM) | slot pass frequency (RPM family) | winding | | time between starts |
| low frequency non-synchronous (1 × RPM to 8 × RPM) | inrush | winding rise (winding-ambient) | | time down |
| upper frequency non-synchronous (9 × RPM to 50 × RPM) | | bearing difference (outboard bearing-inboard bearing) | | |
| HFD band (5 KHz – 20 KHz in G's) | | winding rise-bearing difference | | |
| 2 × line frequency | | | | |

Other: insulation degradation
notes:
LF = line frequency, NP = number of poles, SF = slip frequency (synchronous speed-running speed), n = 1, 2, 3, . . . , RPS = running speed (Hz), RPM = RPS × 60

With continued reference to FIG. 6, the processor 18 determines whether the storage interval time has elapsed since the most recent long-term data storage (step 218). If not, the processor 18 increments a counter corresponding to one of ten load ranges in a long-term load histogram (step 220).

If the processor 18 determines at step 218 that the storage interval time has elapsed since the most recent long-term data storage, the processor 18 processes and stores the long-term average and long-term maximum values of all of the trend parameters listed in Table V over the long-term storage interval (step 222). These long-term average and maximum values are based on the values determined at step 206. At this time, the processor 18 also stores the six long-term trend parameter histograms (step 224), resets the long-term histogram counters (step 226), and resets the long-term average and maximum trend data values (step 228).

The load histograms stored during the general acquisition processing provide valuable insight into how well suited is a particular motor for the task in which it is used. For example, if the load histograms indicate that the motor is operating at a percent load of below 100% for a significant amount of time, the motor is under-loaded. An under-loaded motor, one that is too large for its task, is a waste of resources, since a smaller motor could be used for the task. On the other hand, if the is load histograms indicate that the motor is operating at a load factor of above 100% for a significant amount of time, the motor is over-loaded. The windings and bearings of an over-loaded motor age at a rate higher than that of a motor operating at its rated load factor.

A preferred embodiment of the invention generates a compatibility factor indicating how efficiently the motor is utilized in its particular application. The compatibility factor, CF may be expressed as:

$$CF = \frac{LF_{avg}}{LF_{rated}} \times 100\%,$$

where $LF_{avg}$ is the average load factor for all data acquisition intervals comprising either a short-term or long-term storage interval, and $LF_{rated}$ is the motor's rated load factor. The optimum value of CF occurs when $LF_{avg}$ equals $LF_{rated}$ indicating that, on average, the motor is operating at its rated load factor.

Figure 7A:
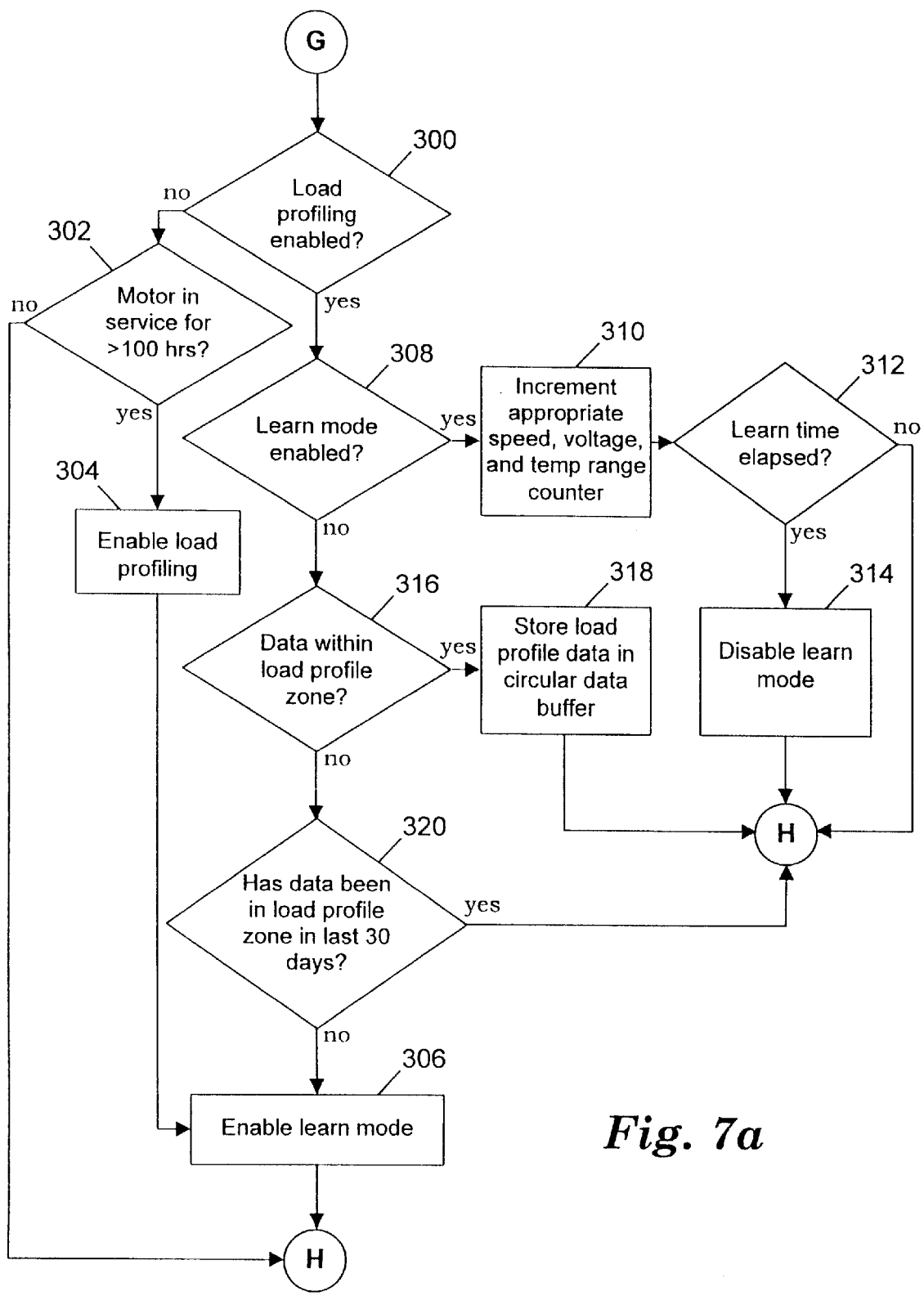
FIG. 7a is a flow diagram illustrating prognostic processing according to the invention.

Preferably, at the completion of the general data acquisition processing, the system 1 begins prognostic processing as shown in FIG. 7a. The preferred embodiment of the system 1 performs prognostic processing to provide a profile of the motor's operating conditions over a period of time without the influences of load, temperature, and voltage variations. This prognostic profile information assists test or maintenance personnel in determining motor "usefulness" and possibly remaining life. Preferably, the load profiling functions are enabled only after a new or refurbished motor has run for 100 hours or more. If the processor 18 determines at step 300 that load profiling is not enabled, then the processor 18 determines, based on the total run time as provided by a real time clock 19, whether the motor has been in service for at least 100 hours (step 302). If the motor has been in service for at least 100 hours, but load profiling is not enabled, then the processor 18 enables load profiling (step 304) and enables a learn mode (step 306). The learn mode is discussed in more detail below. If the motor has not yet been in service for at least 100 hours, then the load profiling functions are skipped, and diagnostic data processing begins at step 322 of FIG. 7b.

If the processor 18 determines at step 300 that load profiling is enabled, then the processor 18 next determines whether the learn mode is enabled (step 308). The learn mode is a processing mode in which the processor 18 determines the ranges of speed, voltage, and winding temperature in which the particular motor typically operates. These typical ranges of speed, voltage, and winding temperature define the motor's typical or "normal" load profile. Thus, if the motor's speed, voltage, and winding temperature fall within their typical range, the motor is said to be operating within its load profile zone. In the preferred embodiment, the system may not enter the learn mode until the motor has been running continuously for at least one hour after start up. Preferably, the system operates in the learn mode for a period of one week after load profiling has been enabled.

While in the learn mode, the system collects and processes sensor data to get an indication of what constitutes baseline operation for the particular motor. As shown in FIG. 7a at step 310, for each data acquisition interval that occurs while the system is in the learn mode, the processor 18 determines a profile prognosis value. Preferably, the profile prognosis value is a four-digit number that represents various combinations of a two-digit temperature profile value, a one-digit voltage profile value, and a one-digit speed profile value.

The temperature profile value (TPV is a decimal value ranging from 00 to 99 determined according to:

$$TPV=(truncate(temp \times 0.1)-adj)+20$$

where temp is the measured winding temperature value in ° C., and where:

adj=0 for temp≧0, and adj=1 for temp<0.

In the preferred embodiment, the voltage profile value (VPV) is a decimal value ranging from 0 to 9 determined based on the measured voltage (MV and the motor's rated nameplate voltage ($V_{rated}$) as shown in Table VI.

TABLE VI

| VPV | measured voltage (MV) range |
|---|---|
| 0 | $0 < MV < V_{rated} - 45$ |
| 1 | $V_{rated} - 45 \leq MV < V_{rated} - 35$ |
| 2 | $V_{rated} - 35 \leq MV < V_{rated} - 25$ |
| 3 | $V_{rated} - 25 \leq MV < V_{rated} - 15$ |
| 4 | $V_{rated} - 15 \leq MV < V_{rated} - 5$ |
| 5 | $V_{rated} - 5 \leq MV < V_{rated} + 5$ |
| 6 | $V_{rated} + 5 \leq MV < V_{rated} + 25$ |
| 7 | $V_{rated} + 25 \leq MV < V_{rated} + 35$ |
| 8 | $V_{rated} + 35 \leq MV < V_{rated} + 45$ |
| 9 | $MV \geq V_{rated} + 45$ |

Preferably, the slip profile value (SPV) is a decimal value ranging from 0 to 9 determined based on the calculated motor slip (slip) and the motor's rated slip ($slip_{rated}$) as shown in Table VII. The calculated motor slip is determined according to:

$$slip=sync\_rps-rps,$$

where rps is the measured running speed of the motor and sync_rps is the synchronous running speed of the motor. In the preferred embodiment, sync_rps is defined as:

$$sync\_rps=(2 \times LF) \div number\ of\ poles,$$

where LF is the line frequency.

The most common mode of motor operation is defined by determining which profile prognosis value occurs most often during the learning period. This is done by storing the fifty profile prognosis values that occur most often during the learning period, and a count value representing an occurrence count for each of the fifty most common values. Preferably, the fifty most common profile prognosis values and the occurrence count for each are stored in a 50×2 array. At the end of the learning period, the profile prognosis value having the highest occurrence count is considered the most common profile prognosis condition for the motor.

Preferably, if there are two or more profile prognosis values having the same count, the most common occurrences will be chosen with priority as follows: (1) Choose the profile prognosis value indicating the lowest motor speed. (2) If the speed values are the same, then choose the profile prognosis value indicating the highest temperature value. (3) If the speeds and the temperatures are the same, then choose the profile prognosis value indicating the highest voltage value.

TABLE VII

| SPV | slip range |
| --- | --- |
| 0 | $0 \leq \text{slip} < 0.45 \times \text{slip}_{rated}$ |
| 1 | $0.45 \times \text{slip}_{rated} \leq \text{slip} < 0.55 \times \text{slip}_{rated}$ |
| 2 | $0.55 \times \text{slip}_{rated} \leq \text{slip} < 0.65 \times \text{slip}_{rated}$ |
| 3 | $0.65 \times \text{slip}_{rated} \leq \text{slip} < 0.75 \times \text{slip}_{rated}$ |
| 4 | $0.75 \times \text{slip}_{rated} \leq \text{slip} < 0.85 \times \text{slip}_{rated}$ |
| 5 | $0.85 \times \text{slip}_{rated} \leq \text{slip} < 0.95 \times \text{slip}_{rated}$ |
| 6 | $0.95 \times \text{slip}_{rated} \leq \text{slip} < 1.05 \times \text{slip}_{rated}$ |
| 7 | $1.05 \times \text{slip}_{rated} \leq \text{slip} < 1.15 \times \text{slip}_{rated}$ |
| 8 | $1.15 \times \text{slip}_{rated} \leq \text{slip} < 1.25 \times \text{slip}_{rated}$ |
| 9 | $\text{slip} \geq 1.25 \times \text{slip}_{rated}$ |

With reference to FIG. 7a, if the learn mode is not enabled (step 308), then the processor 18 determines whether the profile prognosis value calculated for the current data acquisition pass is equivalent to the most common profile prognosis value determined when the system was in the learn mode (step 316). If so, the processor 18 processes and stores load profile data (step 318), including the trend parameters listed in Table V, high-frequency and low-frequency vibration spectra, high-frequency and low-frequency flux spectra, and an average voltage spectrum (7.5–3000 Hz, 800 lines) according to Table III. In the preferred embodiment, each stored spectrum is an average of four measured spectra. This data is stored in the SRAM 22, with the most recent data over-writing the oldest data. Preferably, once during each month, the most recent data in the SRAM 22 is written to a long-term FIFO buffer within the SRAM 22. After storing the load profile data (step 318), the processor 18 begins diagnostic processing.

If the processor 18 determines that no profile prognosis value calculated for a data acquisition pass within the last 30 days has been equivalent to the most common profile prognosis value determined when the system was in the learn mode (step 320), the processor 18 enables the learn mode (step 306) to begin another learning period. In this manner, should the motor's load conditions change for any reason, the system will redetermine the motor's load profile with respect to speed, temperature, and average voltage. Thus, the stored long-term (monthly) prognostic data should always represent the motor's typical load conditions for the previous month. In the preferred embodiment, an operator may initiate the learn mode at any time by sending an appropriate command over a communications interface 56. The communications interface 56 is discussed in greater detail hereinafter.

Figure 7B:
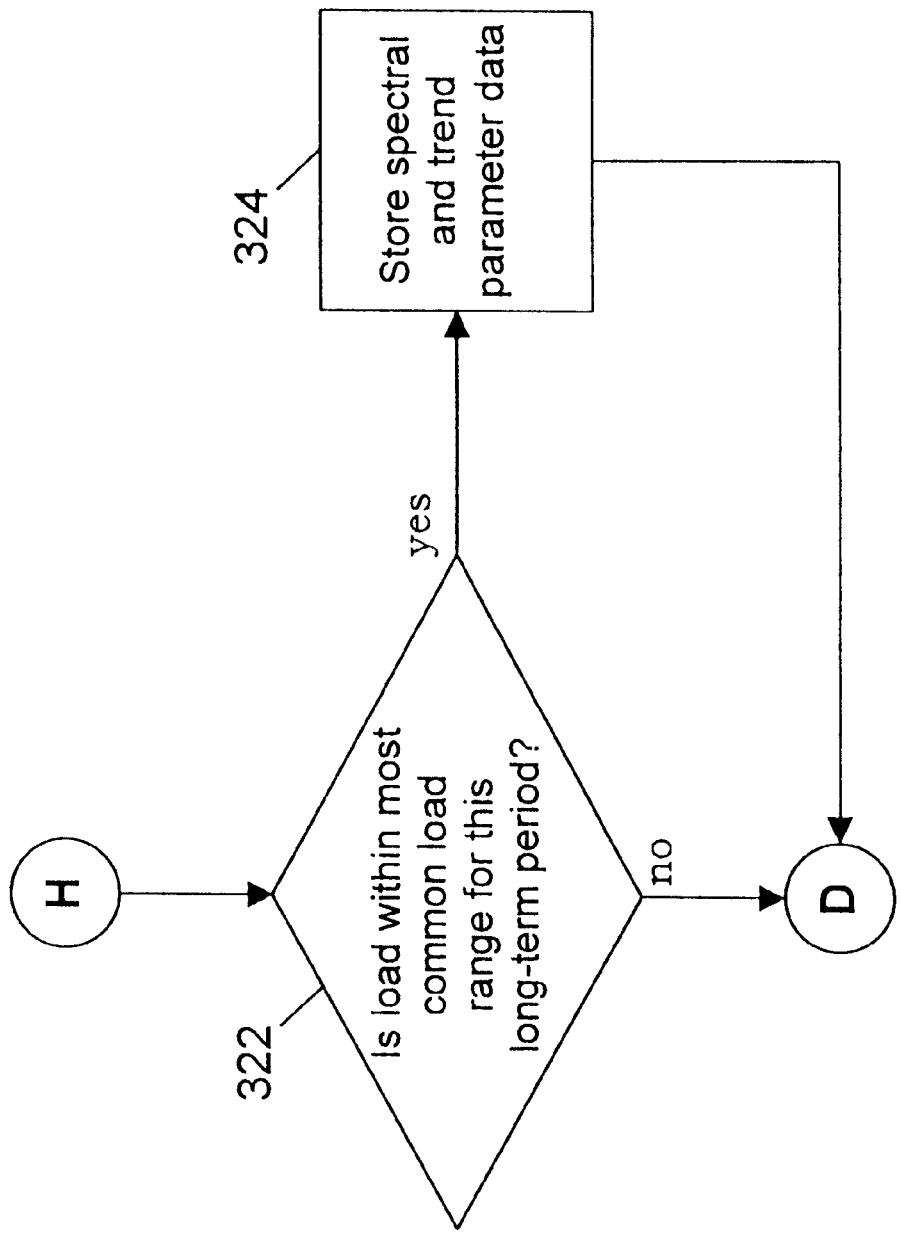
FIG. 7b is a flow diagram illustrating diagnostic processing according to the invention.

One of the purposes of diagnostic processing, as represented by the flow diagram of FIG. 7b, is to store data indicative of the motor's operation while the motor is operating within its most common load zone. Among other things, this data is useful for expert system analysis. The long-term load histogram range having the highest count is the motor's most common load zone for the long-term data storage period. As shown in FIG. 7b, if the motor's percent load falls within the most common load zone for the current long-term data storage period (step 322), the processor 18 stores diagnostic data in the form of trend parameter data (Table V) and spectral data (Table IV) within the XSRAM 22 (step 324). For example, the most common load zone of the histogram shown in FIG. 8 is 95–105%. For this case, the processor 18 would store the trend and spectral data from the current pass as diagnostic data if the percent load calculated for the current data acquisition pass falls within the 95–105% range. In the preferred embodiment, the SRAM 22 includes a six-bin FIFO data storage area for the long-term data storage. Thus, data for the latest six month period is always available in the SRAM 22.

With reference to FIG. 3, the preferred communications interface 56, such as an RS232 or RS485 or equivalent serial data interface, provides for transfer of the motor data stored in the memory 22 to an external computer, such as a personal data assistant (PDA). The interface 56 also provides for transferring new firmware instructions and parameters (such as motor design coefficients) from an external computer to the processor 18. The communications interface 56 includes an interface connector which is attached to the junction box 9 and is accessible on an outside surface of the junction box 9. With this embodiment, it is anticipated that, periodically, maintenance personnel will temporarily connect the PDA to the interface 56 via an interface cable, download the motor data to the PDA, disconnect the PDA, and then proceed to the next motor on a data collection route.

In another embodiment, the communications interface 56 is an RS232 or RS485 or equivalent serial data interface that is hard-wired to a communications hub, where several other motor monitoring systems may also be connected. In this embodiment, the motor data is transferred from the communications hub via a network interface protocol, such as Ethernet or TCP/IP, to an external computer where the motor data is further processed and analyzed.

At least two options are available for collecting and processing the stored data using the PDA. In one option, the PDA is used as a data gatherer only, with no data display capability. In this option, the PDA is simply a data transport device, used to move the motor data from the monitoring system 1 to an external computer, such as a desktop PC, where the data is analyzed and archived. Another option for data collection and processing utilizes a full Windows™ compatible PDA or laptop computer running the necessary data analysis software.

It is contemplated, and will be apparent to those skilled in the art from the preceding description and the accompanying drawings that modifications and/or changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A method for monitoring an operational condition of an electric motor, and for storing in a memory device information indicative of the motor's operational condition, where the motor rotates at a rotational speed to drive a load, generates vibration and magnetic flux, and attains a temperature when a voltage is applied to the motor, the method comprising the steps of:

(a) sensing characteristics indicative of the operational condition of the electric motor;

(b) generating sensor signals related to the sensed characteristics, the sensor signals including a speed signal, a temperature signal, and a voltage signal;

(c) extracting a speed value from the speed signal, a temperature value from the temperature signal, and a voltage value from the voltage signal, where the speed value, temperature value, and voltage value are numerical values indicative of the speed, temperature, and voltage, respectively, of the electric motor;

(d) combining the speed value, temperature value, and voltage value to form a profile prognosis value;

(e) during a learning period, repeating steps (a)–(d) n number of times to determine n number of profile prognosis values; and (f) determining a most common profile prognosis value which is the profile prognosis value of the n number of profile prognosis values occurring most often during the learning period.

2. The method of claim 1 wherein the speed value comprises a decimal value having x number of digits, the temperature value comprises a decimal value having y number of digits, and the voltage value comprises a decimal value having z number of digits, and wherein step (d) further comprises combining the x digits of the speed value, the y digits of the temperature value, and the z digits of the voltage value to form the prognosis profile value having x+y+z number of digits.

3. The method of claim 2 wherein the speed value is a single digit value ranging from 0 to 9, the temperature value is a two-digit value ranging from 00 to 99, the voltage value is a single digit value ranging from 0 to 9, and the prognosis profile value is a four-digit value ranging from 0000 to 9999.

4. The method of claim 1 further comprising:
(g) during a period of time subsequent to the learning period, repeating steps (a)–(d);
(h) determining whether the profile prognosis value determined in step (g) is substantially equivalent to the most common profile prognosis value determined in step (f);
(i) if the profile prognosis value determined in step (g) is substantially equivalent to the most common profile prognosis value determined in step (f), gathering prognostic information from the sensor signals during the period of time subsequent to the learning period.

5. The method of claim 4 wherein the gathering of prognostic information in step (i) further comprises:
(i1) sensing the vibration of the electric motor;
(i2) generating a vibration signal based on the vibration; and
(i3) extracting vibration information from the vibration signal and storing the vibration information in the memory device.

6. The method of claim 5 wherein the steps of extracting vibration information from the vibration signal and storing the vibration information in the memory device further comprises generating a vibration spectrum based on the vibration signal and storing the vibration spectrum in the memory device.

7. The method of claim 4 wherein the gathering of prognostic information in step (i) further comprises:
(i1) sensing the flux of the electric motor;
(i2) generating a flux signal based on the flux; and
(i3) extracting flux information from the flux signal and storing the flux information in the memory device.

8. The method of claim 7 wherein the steps of extracting flux information from the flux signal and storing the flux information in the memory device further comprises generating a flux spectrum based on the flux signal and storing the flux spectrum in the memory device.

9. The method of claim 4 wherein the gathering of prognostic information in step (i) further comprises:
(i1) sensing the voltage of the electric motor;
(i2) generating a voltage signal based on the voltage; and
(i3) extracting voltage information from the voltage signal and storing the voltage information in the memory device.

10. The method of claim 9 wherein the steps of extracting voltage information from the voltage signal and storing the voltage information in the memory device further comprises generating a voltage spectrum based on the voltage signal and storing the voltage spectrum in the memory device.

11. The method of claim 1 wherein the step of determining prognostic information further comprises:
extracting sensor values from at least one sensor signal at periodic intervals during first and second time periods, where the sensor values are indicative of at least one sensed characteristic, and where the second time period follows the first time period;
determining into which of several predetermined ranges each sensor value falls at each interval during the first and second time periods;
determining a prognosis profile value based on the sensor values; determining a normal range for the prognosis profile value, where the normal range is a range within which the prognosis profile value most often falls during the first time period;
determining that the first circumstance has occurred when the prognosis profile value falls within the normal range; and
extracting information from the sensor signals and storing the information in the memory device at periodic intervals during the second time period upon each occurrence of the first circumstance.

12. The method of claim 1 wherein step (c) further comprises:
(c1) determining into which of several predetermined speed ranges the speed signal falls;
(c2) determining the speed value based upon the predetermined speed range determined in step (c1);
(c3) determining into which of several predetermined voltage ranges the voltage signal falls; and
(c4) determining the voltage value based upon the predetermined voltage range determined in step (c3).

13. A method for monitoring an operational condition of an electric motor, and for storing in a memory device information indicative of the motor's operational condition, where the motor rotates at a rotational speed to drive a load, generates vibration and magnetic flux, and attains a temperature when a voltage is applied to the motor, the method comprising the steps of:
(a) sensing characteristics indicative of the operational condition of the electric motor;
(b) generating sensor signals related to the sensed characteristics;
(c) determining a percent load factor corresponding to the load driven by the motor;
(d) determining whether the percent load factor is within a load factor range that is most common for the motor; and
(e) if the percent load factor is within the load factor range that is most common for the motor, determining diagnostic information from the sensor signals, where the diagnostic information is indicative of the motor's typical operational condition.

14. The method of claim 5 wherein:
step; (a) further comprises sensing the voltage, flux, temperature, and vibration;
step (b) further comprises generating voltage, flux, temperature, and vibration signals based on the sensed characteristics; and
determining diagnostic information in step (e) further comprises extracting voltage, flux, temperature, and vibration information from the voltage, flux, temperature, and vibration signals.

15. The method of claim 14 wherein the step of determining diagnostic information further comprises:

generating a vibration spectrum based on the vibration signal;

generating a flux spectrum based on the flux signal;

generating a voltage spectrum based on the voltage signal; and storing the vibration, flux, and voltage spectra in the memory device.

16. A method for monitoring an operational condition of an electric motor, and for storing in a memory device information indicative of the motor's operational condition, where the motor rotates at a rotational speed to drive a load, generates vibration and magnetic flux, and attains a temperature when a voltage is applied to the motor, the method comprising the steps of:

(a) sensing characteristics indicative of the operational condition of the electric motor;

(b) generating a plurality of sensor signals related to the sensed characteristics;

(c) determining at a first time whether at least one value associated with any of the sensor signals exceeds a predetermined threshold level;

(d) when it is determined that at least one value associated with any of the sensor signals exceeds the predetermined threshold level at the first time:
  (d1) generating an alarm signal; and
  (d2) storing hazardous event information indicative of the motor's operational condition;
  (d3) designating the at least one value that exceeds the predetermined threshold level at the first time as locked out of alarm;

(e) determining at a second time subsequent to the first time whether the at least one value designated as locked out of alarm continues to exceed the threshold level at the second time; and (f) when it is determined that the at least one value designated as locked out of alarm continues to exceed the threshold level at the second time, determining whether to redesignate the at least one value previously designated as locked out of alarm to not locked out of alarm based upon one or more characteristics of the value previously designated as locked out of alarm.

17. The method of claim 16 wherein step (f) further comprises:

(f1) determining at the second time whether the at least one value designated as locked out of alarm has changed by at least a predetermined amount; and (f2) when it is determined that the at least one value designated as locked out of alarm has changed by at least the predetermined amount at the second time:
  (f2i) designating the at least one value previously designated as locked out of alarm as not locked out of alarm;
  (f2ii) generating an alarm signal; and
  (f2iii) storing hazardous event information indicative of the motor's operational condition.

18. The method of claim 16 wherein step (f) further comprises:

(f1) determining at the second time whether the at least one value designated as locked out of alarm has changed by at least a predetermined amount; and (f2) when it is determined that the at least one value designated as locked out of alarm has not changed by at least the predetermined amount at the second time, maintaining the designation of locked out of alarm for the at least one value previously designated as locked out of alarm.

19. The method of claim 16 wherein step (f) further comprises:

(f1) determining at the second time whether at least a maximum lock-out time has elapsed since the at least one value designated as locked out of alarm was first designated as locked out of alarm; and (f2) if it is determined that at least the maximum lock-out time has elapsed since the at least one value designated as locked out of alarm was first designated as locked out of alarm,
  (f2i) designating the at least one value previously designated as locked out of alarm as not locked out of alarm;
  (f2ii) generating an alarm signal; and
  (f2iii) storing hazardous event information indicative of the motor's operational condition.

20. A method for monitoring an operational condition of an electric motor, and for storing in a memory device information indicative of the motor's operational condition, where the motor rotates at a rotational speed to drive a load, generates vibration and magnetic flux, and attains a temperature when a voltage is applied to the motor, and where the memory device includes m number of storage locations, the method comprising the steps of:

(a) sensing characteristics indicative of the operational condition of the electric motor;

(b) generating a plurality of sensor signals related to the sensed characteristics;

(c) extracting sensor information from the sensor signals;

(d) determining whether at least one value associated with any of the sensor signals exceeds a predetermined threshold level;

(e) if at least one value associated with any of the sensor signals exceeds the predetermined threshold level,
  (e1) determining a current identification value indicating each of the plurality of sensor signals that is associated with a value that exceeds the predetermined threshold level; and
  (e2) storing the current identification value and associated sensor information in an mth storage location in the memory device;

(f) determining whether all of the m−1 storage locations in the memory device other than the mth location are occupied by information; and (g) if all of the m−1 storage locations other than the mth location are not occupied by information, copying the current identification value and associated sensor information to an available storage location in the memory device.

21. A method for monitoring an operational condition of an electric motor, and for storing in a memory device information indicative of the motor's operational condition, where the motor rotates at a rotational speed to drive a load, generates vibration and magnetic flux, and attains a temperature when a voltage is applied to the motor, and where the memory device includes m number of storage locations, the method comprising the steps of:

(a) sensing characteristics indicative of the operational condition of the electric motor;

(b) generating a plurality of sensor signals related to the sensed characteristics;

(c) extracting sensor information from the sensor signals;

(d) determining whether at least one value associated with any of the sensor signals exceeds a predetermined threshold level;

(e) if at least one value associated with any of the sensor signals exceeds the predetermined threshold level:
  (e1) determining a current identification value indicating each of the plurality of sensor signals that is associated with a value that exceeds the predetermined threshold level, and
  (e2) storing the current identification value and associated sensor information in an mth storage location in the memory device;
(f) determining whether all of the m−1 storage locations other than the mth location are occupied by information; and
(g) if all of the m−1 storage locations other than the mth location are occupied by information, retrieving an identification value from a first retrieval location, where the first retrieval location is one of the m−1 storage locations other than the mth location, and determining whether the identification value retrieved from the first retrieval location is equivalent to the current identification value.

22. The method of claim 21 further comprising:
(h) if the identification value retrieved from the first retrieval location is equivalent to the current identification value, storing the current identification value and the associated sensor information to the first retrieval location.

23. The method of claim 21 further comprising:
(h) if the identification value retrieved from the first retrieval location is not equivalent to the current identification value, retrieving an identification value from a second retrieval location, where the second retrieval location is one of the m−1 storage locations other than the mth location and the first retrieval location, and determining whether the identification value retrieved from the second retrieval location is equivalent to the current identification value.

24. The method of claim 21 further comprising:
(h) determining a current priority value associated with the current identification value;
(i) determining a first retrieval priority value associated with the identification value retrieved from the first retrieval location; and
(j) if the current priority value is greater than the first retrieval priority value, storing the current identification value and the associated sensor information to an m−1 storage location.

25. A method for monitoring an operational condition of an electric motor having a rated load factor that rotates at a rotational speed to drive a load, generates vibration and magnetic flux, and attains a temperature when a voltage is applied to the motor, and for providing an indication to monitoring personnel of how well suited the motor is to drive the load under particular load conditions, the method comprising the steps of:
(a) sensing characteristics indicative of the load conditions;
(b) generating a plurality of sensor signals related to the sensed characteristics;
(c) determining diagnostic information indicative of the motor's normal operation, including determining an average load factor indicative of the load conditions based on at least one of the sensor signals; and
(d) determining a numerical compatibility factor that quantifies, based on the average load factor and the rated load factor, how well suited the motor is to drive the load under the particular load conditions.

26. A method for monitoring an operational condition of an electric motor that rotates at a rotational speed to drive driven equipment, generates vibration and magnetic flux, and attains a temperature when a voltage is applied to the motor, and for ascertaining motor information indicative of the operational condition of the motor and the driven equipment, the method comprising the steps of:
providing equipment data about the driven equipment;
sensing a characteristic of the electric motor while the motor is driving the driven equipment;
generating a sensor signal related to the sensed characteristic; and
extracting driven equipment information from the sensor signal based on the equipment data, where the extracted driven equipment information depends at least in part upon the equipment data and relates to the operational condition of the driven equipment.

27. The method of claim 26, wherein the driven equipment includes a coupling that couples the motor to the driven equipment, the method further comprising the steps of:
providing coupling data about the coupling; and
extracting coupling information from the sensor signal based on the coupling data, where the extracted coupling information depends at least in part upon the coupling data and relates to an operational condition of the coupling.

28. The method of claim 26 further comprising:
storing the equipment information in a memory device;
accessing the equipment information from the memory device;
ascertaining, based upon the equipment information, equipment rotational frequency bands related to rotational frequency characteristics of the driven equipment while the driven equipment is being driven by the motor; and
extracting the motor information from the sensor signal based upon the equipment rotational frequency bands.

29. The method of claim 26 further comprising the step of determining, based upon the motor information, whether the operational condition of the motor is normal or abnormal.

30. The apparatus of claim 29 wherein the winding temperature monitor circuit further comprises:
a memory device for storing a predetermined threshold value; and
a controller for receiving the winding temperature signal, for accessing the predetermined threshold value from the memory device, for comparing the amplitude of the winding temperature signal to the predetermined threshold value, and for producing the second alarm signal when the amplitude of the winding temperature signal exceeds the threshold value.

31. The apparatus of claim 29 wherein the annunciator circuit further comprises a relay switch that changes state when the annunciator circuit receives the first or second alarm signal.

32. An apparatus for monitoring operational characteristics of an electric induction motor over a period of time, the motor having a winding and having a rotor that rotates at a rotational speed to drive a load, the rotor supported at one end by a first bearing and supported at an opposing end by a second bearing, the first and second bearings, which are supported by a motor frame, enabling rotation of the rotor relative to a stator, the motor generating vibration and magnetic flux, and attaining a temperature when a voltage is applied to the winding, the apparatus comprising:

a temperature sensor disposed adjacent to the winding for sensing the winding temperature and generating a winding temperature signal having an amplitude related to the winding temperature;

a processor for receiving the winding temperature signal and for extracting winding temperature information from the winding temperature signal, the processor further operable to determine, based on the amplitude of the winding temperature signal, when the motor is operating abnormally, and for generating an alarm signal when the amplitude of the winding temperature signal indicates that the motor is operating abnormally;

a first memory device for receiving and storing the winding temperature information; and a winding temperature monitor circuit for receiving and continuously monitoring the winding temperature signal, for determining, based on the amplitude of the winding temperature signal, when the motor is operating abnormally, and for generating an alarm signal when the amplitude of the winding temperature signal indicates that the motor is operating abnormally, the winding temperature monitor circuit comprising:

a second memory device for storing a predetermined threshold value and a predetermined time limit; and a controller for accessing the predetermined time limit and the predetermined threshold value from the second memory device, for determining a length of time during which the amplitude of the winding temperature signal exceeds the threshold value, for comparing the length of time to the predetermined time limit, and for generating the alarm signal when the length of time exceeds the predetermined time limit;

the processor further operable to receive the alarm signal, and to extract winding temperature information from the winding temperature signal when the alarm signal is received, the processor and the winding temperature monitor circuit thereby providing temperature monitoring redundancy; and an annunciator circuit operable to receive the alarm signal to give an indication of an abnormal motor condition when the annunciator circuit receives the alarm signal.

33. An apparatus for monitoring operational characteristics of an electric induction motor over a period of time, the motor having a winding and having a rotor that rotates at a rotational speed to drive a load, the rotor supported at one end by a first bearing and supported at an opposing end by a second bearing, the first and second bearings, which are supported by a motor frame, enabling rotation of the rotor relative to a stator, the motor generating vibration and magnetic flux, and attaining a temperature when a voltage is applied to the winding, the apparatus comprising:

a temperature sensor disposed adjacent to the winding for sensing the winding temperature and generating a winding temperature signal having an amplitude related to the winding temperature;

a processor for receiving the winding temperature signal and for extracting winding temperature information from the winding temperature signal, the processor further operable to determine, based on the amplitude of the winding temperature signal, when the motor is operating abnormally, and for generating an alarm signal when the amplitude of the winding temperature signal indicates that the motor is operating abnormally;

a first memory device for receiving and storing the winding temperature information; and a winding temperature monitor circuit for receiving and continuously monitoring the winding temperature signal, for determining, based on the amplitude of the winding temperature signal, when the motor is operating abnormally, and for generating an alarm signal when the amplitude of the winding temperature signal indicates that the motor is operating abnormally, the winding temperature monitor circuit comprising:

a second memory device for storing a predetermined threshold value and a predetermined time limit; and a controller for accessing the predetermined time limit and the predetermined threshold value from the second memory device, for determining a length of time which begins when voltage is applied to the motor winding and which ends when the amplitude of the winding temperature signal exceeds the predetermined threshold value, and for generating the alarm signal when the length of time exceeds the predetermined time limit;

the processor and the winding temperature monitor circuit thereby providing temperature monitoring redundancy; and an annunciator circuit operable to receive the alarm signal to give an indication of an abnormal motor condition when the annunciator circuit receives the alarm signal.

34. An apparatus for monitoring operational characteristics of an electric induction motor over a period of time, the motor having a winding and having a rotor that rotates at a rotational speed to drive a load, the rotor supported at one end by a first bearing and supported at an opposing end by a second bearing, the first and second bearings, which are supported by a motor frame, enabling rotation of the rotor relative to a stator, the motor generating vibration and magnetic flux, and attaining a temperature when a voltage is applied to the winding, the apparatus comprising:

a first temperature sensor disposed adjacent to the first bearing, the first temperature sensor generating a first temperature signal related to a first temperature level occurring adjacent to the first bearing;

a second temperature sensor disposed adjacent to the second bearing, the second temperature sensor generating a second temperature signal related to a second temperature level occurring adjacent to the second bearing;

differentiating means for receiving the first and second temperature signals, and for determining a temperature difference between the first and second temperature levels based upon the first and second temperature signals; and annunciation means for generating an annunciation signal when the temperature difference exceeds a predetermined limit.

35. The apparatus of claim 34 further comprising:

the first temperature sensor generating an analog first temperature signal;

the second temperature sensor generating an analog second temperature signal;

analog-to-digital converter means for generating a digital first temperature signal based upon the analog first temperature signal, and for generating a digital second temperature signal based upon the analog second temperature signal;

the differentiating means further comprising a digital processor for receiving the digital first and second temperature signals, and for determining the temperature difference between the first and second temperature levels based upon the digital first and second temperature signals; and the annunciation means further comprising the digital processor for generating the annunciation signal when the temperature difference exceeds the predetermined limit for at least a predetermined time period.

36. The apparatus of claim 34 wherein the annunciation means further generate the annunciation signal when the temperature difference exceeds a sum of the predetermined limit plus an integer multiple of a predetermined difference increase value.

37. An apparatus for monitoring operational characteristics of an electric induction motor over a period of time, the motor having a winding and having a rotor that rotates at a rotational speed to drive a load, the rotor supported at one end by a first bearing and supported at an opposing end by a second bearing, the first and second bearings, which are supported by a motor frame, enabling rotation of the rotor relative to a stator, the motor generating vibration and magnetic flux, and attaining a temperature when a voltage is applied to the winding, the apparatus comprising:

sensors integrated into the motor for sensing characteristics indicative of the operational condition of the motor and for generating a plurality of sensor signals related to the sensed characteristics;

a processor for calculating histograms indicative of the motor's operational condition based on the sensor signals at periodic measurement intervals during the period of time, the histograms calculated by determining into which of a plurality of predetermined value ranges that the values fall at each periodic measurement interval, and determining at how many periodic measurement intervals the values fell into each of the plurality of predetermined value ranges during the period of time; and a memory device for storing the histograms.

38. An apparatus for monitoring operational characteristics of an electric induction motor over a period of time, the motor having a winding and having a rotor that rotates at a rotational speed to drive a load, the rotor supported at one end by a first bearing and supported at an opposing end by a second bearing, the first and second bearings, which are supported by a motor frame, enabling rotation of the rotor relative to a stator, the motor generating vibration and magnetic flux, and attaining a temperature when a voltage is applied to the winding, the apparatus comprising:

temperature sensors for monitoring the temperature of the motor, the temperature sensors further comprising:

a first bearing temperature sensor disposed adjacent to the first bearing, the first bearing temperature sensor for generating a first bearing temperature sensor signal related to a first bearing temperature level occurring adjacent to the first bearing;

a second ;bearing temperature sensor disposed adjacent to the second bearing, the second bearing temperature sensor for generating a second bearing temperature sensor signal related to a second bearing temperature level occurring adjacent to the second bearing;

an ambient temperature sensor for generating an ambient temperature sensor signal related to an ambient air temperature level occurring near the motor frame;

a frame temperature sensor disposed adjacent to the motor frame for generating an frame temperature sensor signal related to a frame temperature level occurring on the motor frame; and a winding: temperature sensor disposed adjacent to the winding, the winding temperature sensor for generating a winding temperature sensor signal related to a winding temperature level occurring adjacent to the winding;

a vibration sensor for monitoring the vibration of the motor and for generating a vibration sensor signal related to the motor vibration;

a flux sensor for monitoring the flux of the motor and for generating a flux sensor signal related to the motor flux;

a winding insulation sensor for monitoring characteristics of insulation in the winding and for generating a winding insulation sensor signal related to the insulation characteristics;

a voltage sensor for monitoring the voltage applied to the winding and for generating a voltage sensor signal related to the voltage;

a signal conditioning circuit for conditioning the vibration, voltage, and flux sensor signals, the signal conditioning circuit comprising:

a signal selection switch having an input and an output, for receiving the vibration and flux sensor signals at the input, for routing the vibration sensor signal to the output when the switch is in a first state, and for routing the flux sensor signal to the output when the switch is in a second state;

a filter circuit comprising:

a high pass filter for attenuating frequency components below a first cutoff frequency of the sensor signal at the output of the signal selection switch;

a low pass filter for attenuating frequency components above a first cutoff frequency of the sensor signal at the output of the signal selection switch; and a filter selection switch for receiving the sensor signal at the output of the signal selection switch, for routing the sensor signal at the output of the signal selection switch to the high pass filter when the filter selection switch is in a first state, and for routing the sensor signal at the output of the signal selection switch to the low pass filter when the filter selection switch is in a second state; and a gain adjust amplifier for adjusting the gain of the sensor signal at the output of the signal selection switch;

a winding temperature monitor circuit for receiving and continuously monitoring the winding temperature sensor signal, for determining when the amplitude of the winding temperature sensor signal exceeds a threshold, and for generating a first alarm signal when the amplitude of the winding temperature sensor signal exceeds the threshold; and a first annunciator circuit that receives and is activated by the first alarm signal, the first annunciator circuit comprising a first relay switch that changes state when the first annunciator circuit receives the first alarm signal;

a processor for receiving the sensor signals, for extracting motor information from the sensor signals, for determining based on the motor information whether the motor is operating abnormally, for determining hazardous event information from the sensor signals when the motor is operating abnormally, for generating a second alarm signal when the motor is operating abnormally, for determining general sensor information when a predetermined period of time has elapsed since a last time that general sensor information was determined, for determining the motor's speed based on the sensor signals, for determining a prognosis profile value based on the speed, temperature, and voltage signals, for determining a normal range within which the prognosis profile value typically falls, for determining prognostic information when the prognosis profile value falls within the normal range, for determining a load factor corresponding to the load driven by the motor and the load capacity of the motor, for determining whether the load factor falls within a most common load factor range for the motor, and for determining diagnostic information when the load factor falls within the most common load factor range;

a memory device for storing the hazardous event information, the general sensor information, the prognostic information, and the diagnostic information;

a second annunciator circuit that receives and is activated by the second alarm signal, the second annunciator circuit comprising a second relay switch that changes state when the second annunciator circuit receives the second alarm signal; and a power conditioning circuit for receiving the voltage applied to the winding and conditioning the voltage to power the apparatus.

* * * * *